INVENTOR.
WILLIAM J. DETTMAN
BY

INVENTOR.
WILLIAM J. DETTMAN
BY

INVENTOR.
WILLIAM J. DETTMAN
BY

INVENTOR.
WILLIAM J. DETTMAN
BY

INVENTOR.
WILLIAM J. DETTMAN
BY

INVENTOR.
WILLIAM J. DETTMAN
BY

INVENTOR.
WILLIAM J. DETTMAN
BY

INVENTOR.
WILLIAM J. DETTMAN
BY

INVENTOR.
WILLIAM J. DETTMAN
BY

*INVENTOR.*
WILLIAM J. DETTMAN
*BY*

Nov. 9, 1965 W. J. DETTMAN 3,216,089

METHOD OF CONNECTING ELECTRICAL COMPONENTS TO SPACED FRAME CONTAINING CIRCUITS AND REMOVING THE FRAMES

Original Filed Oct. 23, 1961 14 Sheets-Sheet 11

INVENTOR.
WILLIAM J. DETTMAN
BY

INVENTOR.
WILLIAM J. DETTMAN
BY

INVENTOR.
WILLIAM J. DETTMAN
BY

INVENTOR.
WILLIAM J. DETTMAN
BY

United States Patent Office 3,216,089

Patented Nov. 9, 1965

3,216,089

METHOD OF CONNECTING ELECTRICAL COMPONENTS TO SPACED FRAME CONTAINING CIRCUITS AND REMOVING THE FRAMES

William J. Dettman, Saratoga, Calif., assignor to Lockheed Aircraft Corporation, Burbank, Calif.

Original application Oct. 23, 1961, Ser. No. 146,974. Divided and this application Mar. 11, 1963, Ser. No. 277,969

6 Claims. (Cl. 29—155.5)

This application is a division of application, Serial No. 146,974 filed October 23, 1961.

This invention relates to a technique for making electrical circuitry and more particularly to a technique employing preformed elements incorporating conductor elements, a frame and support members which provide mechanical continuity during assembly operations.

In general, the present invention incorporates preformed electrical elements which are preferably made by etching techniques. These preformed elements include the common characteristic of mechanically interconnecting electrical conductors to a frame by means of support members all of which may be etched or otherwise formed in a single operation. Two of these preformed elements are mounted in spaced relation in a jig or the like and the lead wires of electrical components are then connected to the proper electrical conductors of each of the two preformed elements. After the electrical components have been connected to the proper electrical conductors, the support members of both preformed elements are severed and the electrical components and electrical conductors are then removed from the frames and severed support members. The electrical components and interconnecting electrical conductors form a unit package since there is both mechanical and electrical continuity.

In the preferred embodiments of the present invention, the electrical conductors are made redundant and the apertures thereof are formed to exert a spring bias against the electrical component lead wires which are inserted therethrough. As will hereinafter become apparent, several advantages are obtained by employing these redundant and spring bias techniques which provide high reliability and ease of assembly.

In another embodiment of the present invention, preformed insulating elements are employed having the same peripheral configuration as the preformed conducting elements such that ease of manufacture and assembly of necessary insulation is accomplished.

In order to enhance the solder joint between the electrical component lead wire and the aperture and to facilitate the ease of insertion of the component lead wire into the aperture, another embodiment provides apertures having frusto-conical interior surfaces. Apertures formed in this manner have large and small diameter openings wherein the lead wire may be initially inserted through the large opening, without the necessity of careful control, and passed through the small opening which is about the same size as the lead wire. Solder may be then applied to the cavity formed between the lead wire and the frusto-conical surface or, if desired, it may be applied to lead wire extending through the small opening and the adjacent conducting material.

Major problems in making modular packaging reliable, inexpensive to produce and amenable to commercial applications is that of formation of the input and output terminal extensions of the modular package as well as the formation of the terminal module to which these terminal extensions are connected. Accordingly, still another embodiment of the present invention is directed to the formation of inexpensive and reliable input and output terminal extensions for modular packages which is accomplished by integrally forming terminal extensions as part of the preformed circuitry which may be readily inserted into a terminal module or the like. In addition, a still further embodiment of the present invention provides a technique for forming a terminal module entirely from preformed circuitry wherein the terminal extensions of the terminal module preformed circuitry are bent at about ninety degrees and are designed such that they may exert a spring bias against terminal extensions of the modular package which may be inserted into contact therewith. In addition, a preformed isolation plate may be provided in the terminal module wherein electrical signals in the terminal module preformed circuitry are isolated thereby preventing undesirable transmission of electrical signals.

Another difficulty found in modular packaging is that of providing means for dissipating heat from certain electrical components. In accordance with the teachings of the preformed circuitry of the present invention, heat dissipation is accomplished by a unique technique wherein a heat sink is integrally formed as part of the preformed circuitry thereby obviating any external heat sink sources. The present invention provides an extremely efficient heat sink since it may consist of a large surface area of virtually any configuration and heat is dissipated from both sides of the heat sink as will hereinafter become apparent.

In order to facilitate repair and modification of modular circuits made in accordance with the present invention, another embodiment sets forth a plurality of preformed elements which have unique configurations that are compatible with and may be individually removed and connected to the preformed circuitry of the modular package. This offers considerable advantages over heretofore developed techniques for repair or modification of modular packages.

Accordingly, an object of the present invention is to provide a technique for forming preformed circuitry which is effective, reliable and easy to manufacture and assemble.

Another object of the present invention is to provide a method for assembling electrical components and electrical conductors wherein the electrical conductors are in mechanical continuity prior to connecting the electrical components, and the electrical components and electrical conductors are in electrical and mechanical continuity after connecting the electrical components to the electrical conductors.

Still another object of the present invention is to provide redundant electrical conductors in preformed circuitry thereby obtaining greater reliability.

A further object of the present invention is to provide electrical conductors having spring biased apertures for receiving electrical lead wires.

A still further object of the present invention is to provide a technique for employing preformed insulating elements having the same peripheral configuration as the preformed conducting elements such that ease of manufacture and assembly of the insulation is accomplished.

A still further object of the present invention is to provide preformed circuitry having apertures with a frusto-concial interior surface which provide ease of insertion of lead wires therethrough or provide a cavity for receipt of solder or the like.

A still further object of the present invention is to provide terminal extensions integrally formed as part of the preformed circuitry from which the modular package is made for insertion into terminal boards or the like.

A still further object of the present invention is to provide a technique for forming terminal boards from preformed circuits.

A still further object of the present invention is to form heat sinks which are integral with the preformed circuits.

A still further object of the present invention is to provide preformed repair elements having configurations which are compatible with and may be individually removed for repair or modification of modular packages made in accordance with the preformed circuity of the present invention.

The specific nature of the invention, as well as other objects, uses and advantages thereof, will clearly appear from the following description and from the accompanying drawing in which.

Like numerals designate like elements throughout the figures of the drawing.

Figure 1:
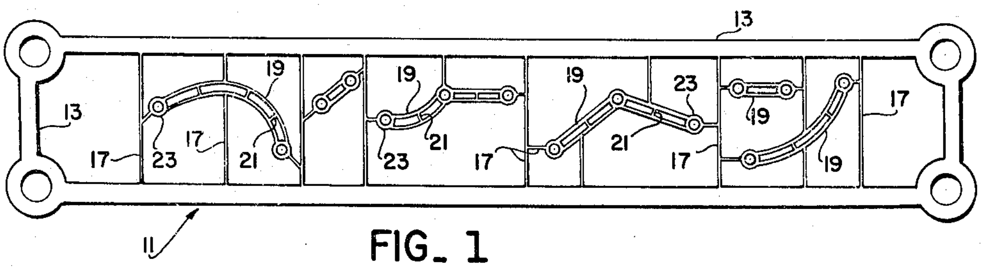
FIGURE 1 illustrates a typical preformed conducting element of the present invention.

In FIGURE 1 is illustrated a typical preformed element, generally denoted by reference numeral 11, made in accordance with the present invention. Element 11 consists of electrical conducting material and is preferably made by conventional etching techniques; however, it may be formed by machining, sandblasting or the like such that the desired configuration and characteristics are realized.

Preformed element 11 consists of an outer frame 13 having openings 15 formed in the corners thereof for receipt of fastening members which function as hereinafter described. It is to be understood that the particular configuration of frame 13 is not critical and that openings 15 may be provided in any convenient position or may be deleted entirely.

Disposed within outer frame 13 are support members 17, redundant conductors 19, cross-over elements 21 and apertures 23. The function of support members 17 is to rigidly interconnect redundant conductors 19, apertures 23 and outer frame 13 such that mechanical continuity of preformed element 11 is realized. The optimum material thickness from which the preformed element is made is about .020 inch and the optimum width of each conductor of the redundant conductor is about .010 inch. It has been found that with most conducting material, these parameters provide a preformed element of sufficient mechanical rigidity that assembly may be readily accomplished. In addition, the mechanical rigidity of the electrical circuit, after assembly (see FIGURE 2C) is very satisfactory and will not deform unless substantial force is applied thereto.

Figure 1A:
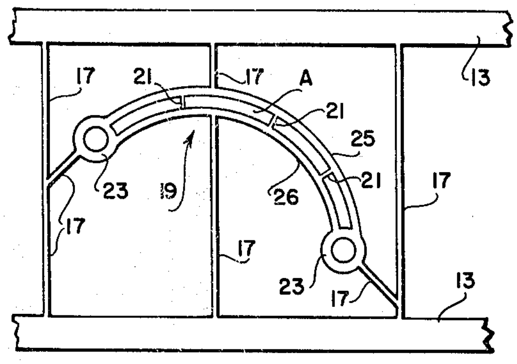
FIGURE 1A is an enlarged section of the preformed element of FIGURE 1.

As best depicted in FIGURE 1A, which is an enlarged view of the left section of the preformed element as viewed in FIGURE 1, redundant conductors 19 consist of spaced apart parallel conductors 25 and 26 and are used to electrically and mechanically connect appropriate apertures 23. Through apertures 23 are inserted lead wires of the appropriate electrical components or jumper wires as will be hereinafter described. Cross-over elements 21 may be employed between these conductors at spaced intervals to maintain rigidity of redundant conductors 19.

There are three primary unique functions of redundant conductors 19 which relate to (1) matrix construction, (2) potting operations. and (3) preforming of the element.

In matrix construction a relatively long dielectric strip, having about the same cross-section as the area between conductors 25 and 26 and cross-over members 21 (for example, the area denoted by the letter A in FIGURE 1A), may be inserted through a stack of preformed element 11 to maintain alignment. Therefore, the redundant conductors provide a simple and accurate method for matrix alignment which would not otherwise be available.

Figure 1B:
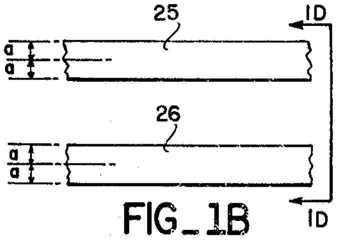
FIGURES 1B, 1C, 1D and 1E illustrate the effect of potting the redundant conductors of the present invention as compared to conventional conductors.
Figure 1C:
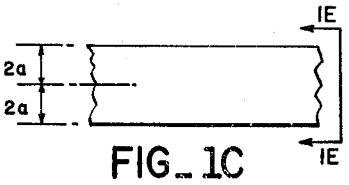
Figure 1D:
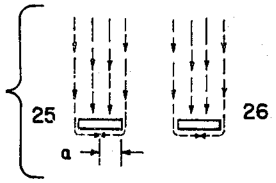
Figure 1E:
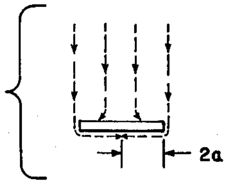

In potting operations the force on the redundant conductors, due to the flow of potting compound normal to the plane defined by conductors 25 and 26, is less than that exerted on conventional conductors having the same strength and resistivity characteristics. This will be more clearly understood by referring to the illustrations set forth in FIGURES 1B through 1E. FIGURES 1B and 1D represent a greatly enlarged section of the redundant conductors of FIGURES 1 and 1A. FIGURES 1C and 1E represent a greatly enlarged section of an equivalent conventional conductor. In order to properly pot the hereinafter described electrical elements, it is necessary that the flow have a direction normal to the plane of the drawing with respect to FIGURES 1B and 1C and in the direction indicated by the dotted lines of FIGURES 1D and 1E. Upon the potting compound initially coming into contact with the upper surface of the conductors, there is a force or pressure differential between the upper and lower surfaces thereof. The length of time this force differential is in existence is extremely important and it is highly desirous to reduce it to a minimum thereby obviating rupture or impairment of the properties of the conductor. Since the velocity of potting compound flow is relatively constant and since the distance (*a*) which the potting compound must flow in the redundant conductor is only half the distance (2*a*) which the potting compound must flow in the equivalent conventional conductor, the time duration of the differential force in the redundant conductor of the present invention is only half that conventionally obtained. It has been found that conductor failure due to the differential force created by the flowing potting compound has been drastically reduced by the redundant conductors of the present invention.

Figure 1F:
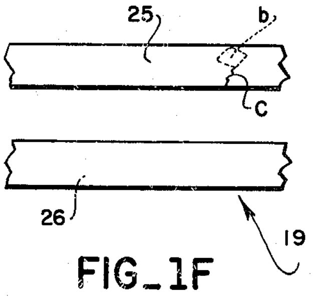
FIGURES 1F and 1G illustrate the effect of impurities or imperfections in making redundant conductors of the present invention as compared to conventional conductors.
Figure 1G:
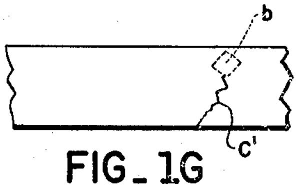

The third unique function of the redundant conductors resides in their ability to reduce the probability of mechanical or electrical failure due to impurities which may be in the electrical conducting material from which they are made. For example, in making etched circuits, random impurities may be in the sheet of electrical conducting material from which the circuit is etched. In FIGURE 1F a random impurity is illustrated by broken lines and is denoted by the reference letter "*b*." Upon the application of a slight force to conductors 25 and 26 of redundant conductor 19, it will be apparent that conductor 25 will fail due to stress concentration along the line denoted by reference letter "*c*." However, conductor 26 will not fail since an impurity and the resultant stress concentration are not present and the applied force does not exceed its capacity. In FIGURE 1G this same random impurity is disposed in a conventional conductor. It will be apparent that upon the application of the same force as applied to the redundant conductor, that the conventional conductor will fail due to stress concentration along the line denoted by reference letter "*c'*." From this it can be seen that from the same sheet of conducting material in which an impurity "*b*" is disposed, that redundant conductor 19 will maintain mechanical and electrical continuity upon the application of a slight force; however, an equivalent conventional conductor will completely fail. It will be appreciated that stress concentrations or conductor weakness may be due to other imperfections; for example, the film resist may extend to the area which is to be etched resulting in a nick or indentation into the conductor.

In FIGURES 2A through 2D is illustrated the sequential steps by which the hereinbefore described preformed elements are employed in a method for coupling electronic components and the like.

Figures 2A, 2B, 2C:
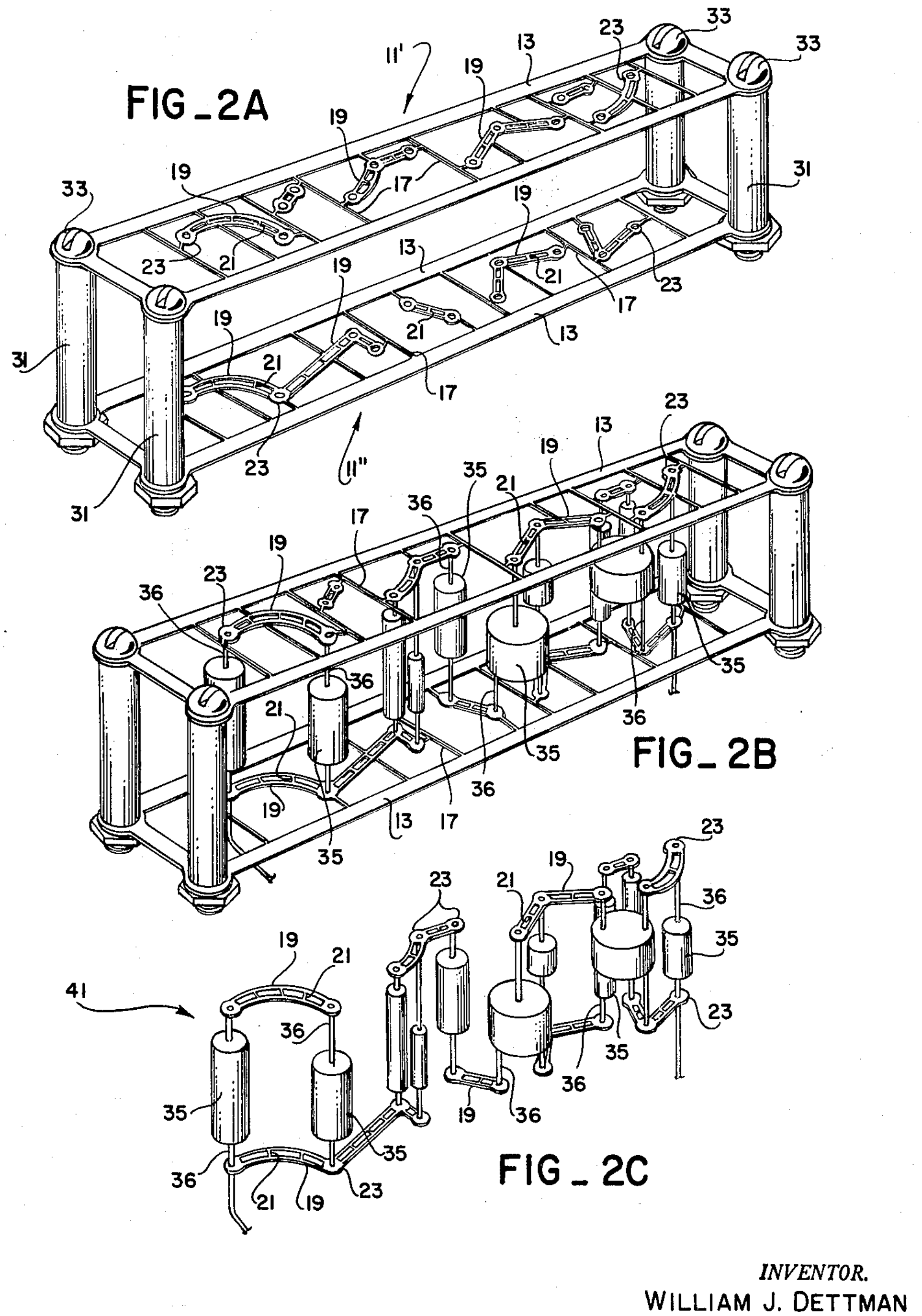
FIGURES 2A through 2D illustrate the method of making complete electronic packages in accordance with the present invention.

In FIGURE 2A are illustrated two preformed elements 11' and 11'' which are maintained in parallel spaced relation by a jig or plurality of spacing members 31. It is to be understood that the shape and material from which spacing members are made are not critical and the only essential function thereof is to maintain elements 11' and 11'' in fixed spaced relation. These spacing members may be tapped or have an opening throughout the entire length thereof for receipt of fastening members 33 which are inserted through opening 15, as best depicted in FIGURE 1, for maintaining fixed spaced relation between elements 11' and 11''. The length of spacing members 31 is selected so the hereinafter described electrical components may be conveniently and easily inserted. It will be particularly noted that elements 11' and 11'' have different patterns thereby providing the desired electrical connections and mechanical continuity as will hereinafter become apparent.

In FIGURE 2B is illustrated the second step for performing the method of the present invention. During this step, electrical components 35 are mounted in their predetermined positions by inserting the lead wires depending therefrom through the proper apertures 23 and are electrically connected in place by means of solder, weld, electrical conducting cement or the like. In order to provide an input or output or make connections to other circuits, one or more of lead wires 36 may extend a substantial distance beyond apertures 23 as illustrated. From FIGURE 2B it can be seen that mechanical as well as electrical continuity is realized between electrical components 35 upon their being rigidly mounted in place.

FIGURE 2C illustrates the third step of the present invention wherein electrical and mechanical continuity of electrical circuit 41 is realized when separated from its supports as illustrated in FIGURE 2B. From FIGURE 2B it can be seen that support member 17 provide an interconnection between redundant conductors 19 and frame 13. After electrical components 35 are rigidly mounted in place as by weld or the like, support members 17 are severed and the electrical components and redundant conductors are removed from frames 13. Severing of support members 17 may be accomplished by many different methods including cutting, sawing, breaking, melting, grinding or the like. It has been found highly satisfactory to sever these support members by cutting, as by means of a pair of diagonals or the like, at a location approximately adjacent the conductor material. Although it has been found satisfactory to attach support member 17 is aperture 23, as illustrated in FIGURES 1 and 1A, it has been found particularly advantageous to attach support members 17 to the redundant conductors, as clearly depicted in FIGURES 8 through 14, rather than to apertures 23. Two primary advantages are gained by virtue of attaching support members 17 to the conductors rather than to the apertures. The first advantage is that impairment of breakage of the connection between the aperture and lead wire during severing of support member 17 is substantially reduced since the force transmitted through the conductor to the aperture is much less than when applied directly to the aperture. The second advantage is gained by rendering the aperture readily accessible to the electrodes of a welding machine or the like. The dimensions, number and placement of these support members is generally not critical, except as hereinabove defined, and will depend largely upon the desired rigidity of the preformed elements during the process steps shown in FIGURES 2A and 2B. This rigidity will also be dependent upon the type and thickness of the material from which the preformed element is made.

Figures 2D, 3, 4, 5, 6:
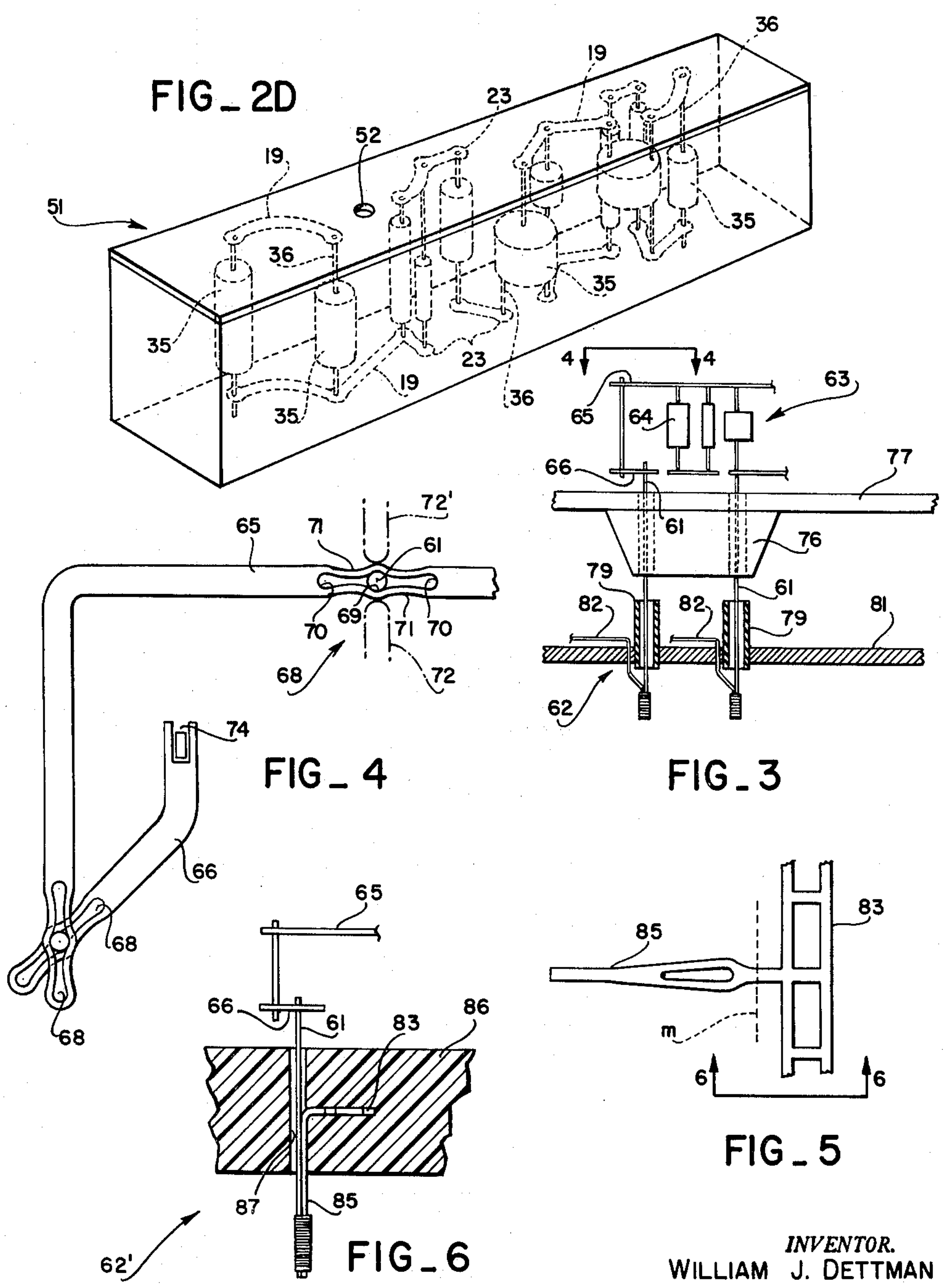
FIGURE 3 illustrates a technique by which the output leads of an electrical circuit made in accordance with the present invention may be connected to a conventional terminal module.
FIGURE 4 is an enlarged sectional view of the electrical circuit taken along line 4—4 of FIGURE 3 and showing spring bias apertures formed in the electrical conductors.
FIGURE 5 illustrates a technique for forming the conductor extension for a terminal module made in accordance with the present invention.
FIGURE 6 illustrates the conductor extensions shown in FIGURE 5 being mounted in a terminal module.

In FIGURE 2D is illustrated the fourth and final step of the method of the present invention and is employed when it is desirable to encapsulate or pot the electrical circuit shown in FIGURE 2C. A typical method by which potting is accomplished is to dispose the electrical circuit in a closed container or mold 51 having small opening 52 in the top thereof. Fluid potting compound may be inserted through this opening or it may be inserted with the cover removed. After the potting compound and electrical circuit are in the container as shown, the container is heated thereby causing substantial expansion of the fluid potting compound resulting in flow of potting compound through opening 52 until there is hardening thereof. After hardening, the potted electrical circuit is removed from container 51. The extended electrical lead wires are not shown in FIGURE 2D; however, in practice a small opening would be provided in mold 51 to receive these extended leads. As hereinbefore explained, the redundant conductors are uniquely adaptable to a potting process of this type since the time duration of the differential force due to flow of the potting compound is considerably reduced as compared to conventional techniques and it has been found that circuit failures due to this differential force are virtually eliminated by the utilization of redundant conductors.

It is to be understood that the above defined process may include or exclude the potting step as above described and illustrated in FIGURE 2D since, in many applications, it may be desirable to employ the electrical circuit as illustrated in FIGURE 2C and therefore omit the potting step.

In summary, the method of the present invention includes the steps of (1) mounting in spaced relation a pair of preformed elements each of which has a plurality of conductors and support members interconnecting the conductors and a frame, (2) rigidly connecting a plurality of electrical components to the conductors and (3) removing the electrical components and associated conductor by severing the support members interconnecting the conductors and the associated frame. The fourth potting step is optional.

In FIGURE 3 is illustrated a technique by which the output leads 61 of an electrical circuit made in accordance with the present invention may be connected to a terminal module 62. A portion of the electrical circuit is denoted by reference numeral 63 and includes electrical components 64 and etched electrical conductors 65 and 66.

FIGURE 4 is an enlarged sectional view of the electrical circuit taken along line 4—4 of FIGURE 3 and illustrates spring bias apertures formed in the electrical conductors. Electrical conductors 65 and 66 are illustrated as being solid; however, in most instances they are preferably made redundant in the manner and for the reasons previously explained. Apertures 68, which are formed as illustrated, function to provide a spring bias against the lead wires which are inserted therethrough. The inside diameter of circular section 69 is made slightly smaller than the outside diameter of the smallest lead wire which will be inserted therethrough. Recesses 70 are provided on both sides of circular section 69 thereby forming conductors 71 which bias inwardly when lead wire 61 is inserted in circular section 69. The ends of recesses 70 are curved to reduce stress concentration when the lead wires are mounted. Due to this spring bias characteristic, it will be particularly noted that apertures 68 are capable of receiving a plurality of different diameter lead wires and still maintain facial contact between the lead wire and the circular section of aperture 68. This is extremely important for welding operations since minimum resistance is realized with facial contact, and it has been found that maximum current, as illustrated by the dotted lines, is passed between welding electrodes 72 and 72' thereby creating sufficient heat to form efficient welds. It is to be understood that the configuration of apertures 68 is intended only as representative of the preferred form and substantial departure from this form may be made and still remain within the scope of the present invention provided the hereinabove described bias action is realized. Furthermore, it is to be understood that the apertures shown in FIGURES 1, 1A, 2A and 2B may be modified to provide the above-described bias action. In this regard it is important to note that the spring bias apertures function to hold the electrical components during assembly and therefore permit free use of both hands.

Electrical conductor 66 is provided with a bias aperture 68 at one end and a slot 74 at the other end for receiving an output lead 61 having a rectangular cross-section. As best depicted in FIGURE 3, leads 61 are passed through openings 76 of insulating member 77 and then held in place by cement or the like. These output leads are then passed through insulating tubing 79, which are mounted on base board 81, which is made of dielectric material, and then wire wrapped or the like to electrical conductors 82.

In FIGURE 3 is illustrated a conventional terminal module generally denoted by reference numeral 62, whereas, in FIGURES 5 and 6 is illustrated terminal module 62' which is made in accordance with the present invention. In FIGURE 5 is illustrated an enlarged small section of etched redundant conductor 83 having an etched extension 85 depending therefrom. The dotted line denoted as *"m"* in FIGURE 5 represents the location at which extension 85 is bent to a position where the axis thereof is normal to the plane defined by redunctant conductor 83. It will be particularly appreciated that a network of redundant conductors having a plurality of extensions may be formed in a single etching operation since extensions 85 are etched in the same plane as redundant conductors 83. After the etching operation is completed, extensions 85 are bent as above described. After completion of this extension bending operation, redundant conductors 83 and the upper portions of extensions 85 are disposed in the cavity of a mold and a plurality of dies are inserted into the mold each of which is immediately adjacent the upper portion of extension 85 and extends upward to the top of the mold cavity. The mold cavity is then filled with a potting compound 86 and removed upon hardening thereof. The dies are removed thereby providing opening 87 through which output leads 61 are inserted and wire-wrapped or otherwise connected to extension 85. A more complete presentation of the method by which preformed circuits having extensions molded in a terminal module will be hereinafter described in conjunction with FIGURES 22A through 22C.

An alternative technique by which redundant conductors 83 and extensions 85 may be formed at right angles is to employ a two-dimensional etching technique. This two-dimensional etching technique is implemented by etching two interconnected right angle planes of thin electrical conducting material, for example, two surfaces of a cube formed of copper sheet or the like, wherein one plane includes the redundant conductors and the other plane includes the extensions. It is to be understood that three-dimensional etching may be likewise preformed.

Figure 7:
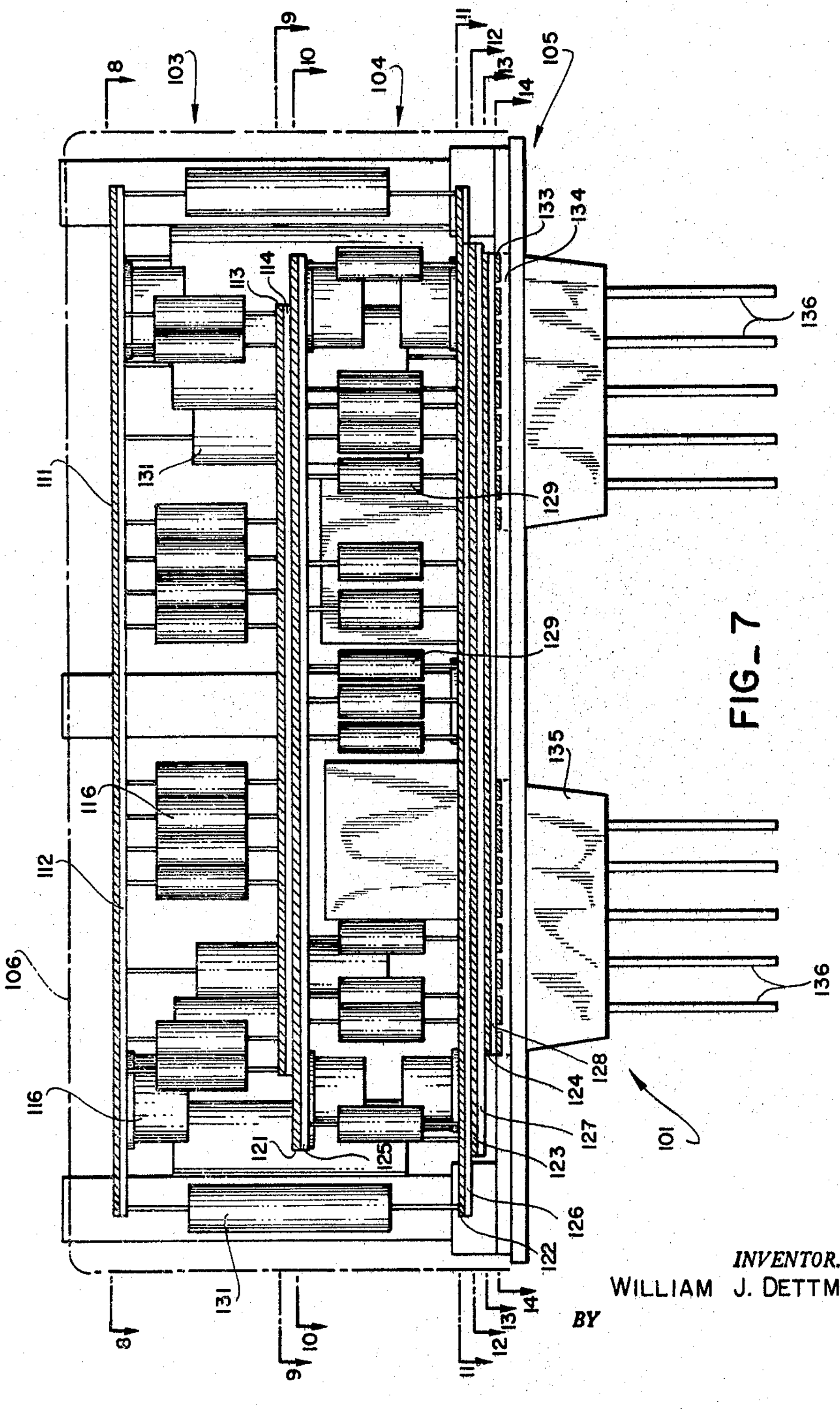
FIGURE 7 illustrates a complete assembled package made in accordance with the present invention.

In FIGURES 7 through 16A is illustrated a complete package made in accordance with the present invention. The assembled package 101 is illustrated in FIGURE 7 which includes electrical sections 103 and 104, header section 105 and an outer casing 106 (illustrated in broken lines).

Electrical section 103 includes preformed conducting element 111, preformed insulating element 112, preformed conducting element 113, preformed insulating element 114 and the associated electrical components 116. Electrical section 104 includes preformed conducting elements 121, 122, 123 and 124, and preformed insulating elements 125, 126, 127 and 128 and the associated electrical components 129. It will be noted that some electrical components, such as the components designated by reference numeral 131, are common to electrical sections 103 and 104. Header section 105 includes preformed conducting element 133, preformed insulating element 134, base member 135 and output leads 136.

A typical configuration of the preformed electrical conductors which have been employed in an operable version of the present invention are illustrated in FIGURES 8 through 14.

Figures 15, 15A:
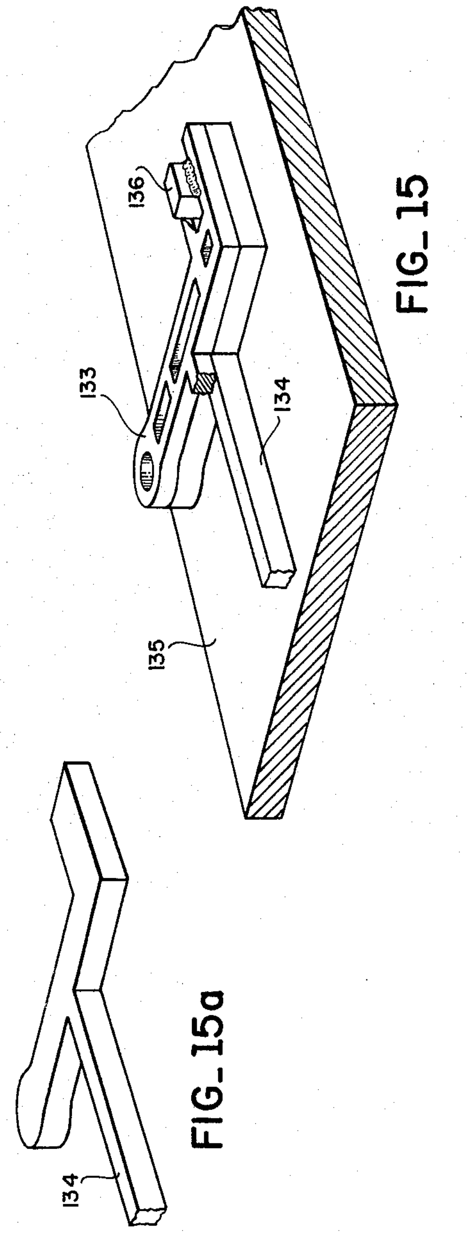
FIGURE 15 illustrates the techinque by which preformed conducting and insulating elements are mounted in the package shown in FIGURE 7.
FIGURE 15A illustrates a modified form of the preformed insulating element.

It will be particularly noted that the preformed insulative elements are formed of the same configuration as the preformed conducting elements. This is accomplished by employing a female mold having the same configuration as the pattern used for forming the preformed conducting elements. The unique advantages obtained by this technique are (1) only one master pattern need be made for the preformed conducting element and the corresponding preformed insulating element, (2) the required insulation is accomplished by the use of a single sheet of material, rather than employing individual insulators, the placement of which is very time consuming, (3) since the preformed insulating elements have the same configuration as the preformed conducting elements the insulation will not physically interfere with mounting the electrical components and (4) as will hereinafter become apparent, the preformed insulating elements provide additional structural support to the package during and after assembly thereof. In FIGURE 15 is shown an enlarged perspective view of a section of preformed conducting element 133 (see FIGURES 7 and 14) and preformed insulating element 134 (see FIGURE 7). It can be seen that preformed insulating element 134 is disposed between and in facial contact with base member 135, which may be made of electrical conducting material, and preformed conducting element 133. As illustrated in FIGURE 15A, preformed insulating element 134 may be made solid and have the exterior configuration of the corresponding preformed conducting element or it may have the identical configuration (both interior and exterior) as the corresponding preformed conducting element.

Figures 8, 9:
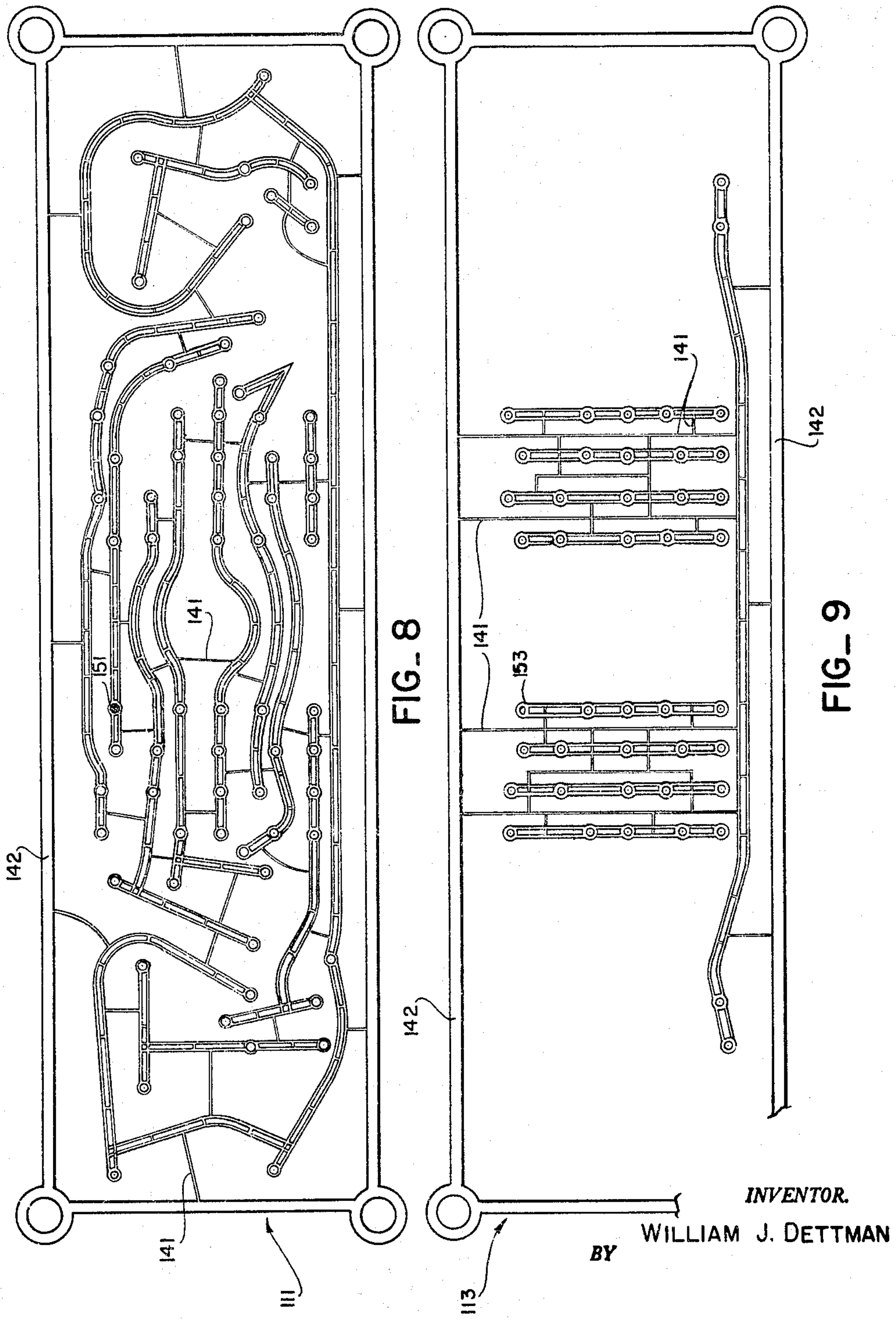
FIGURES 8 through 14 illustrate the preformed conducting elements employed in the package shown in FIGURE 7.
Figure 10:
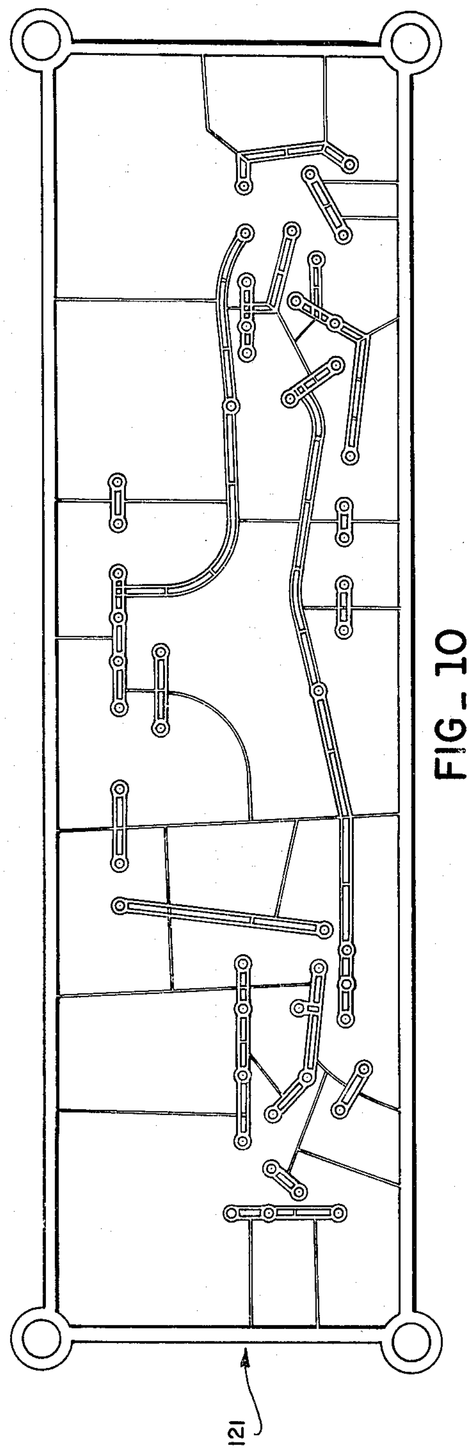
Figure 11:
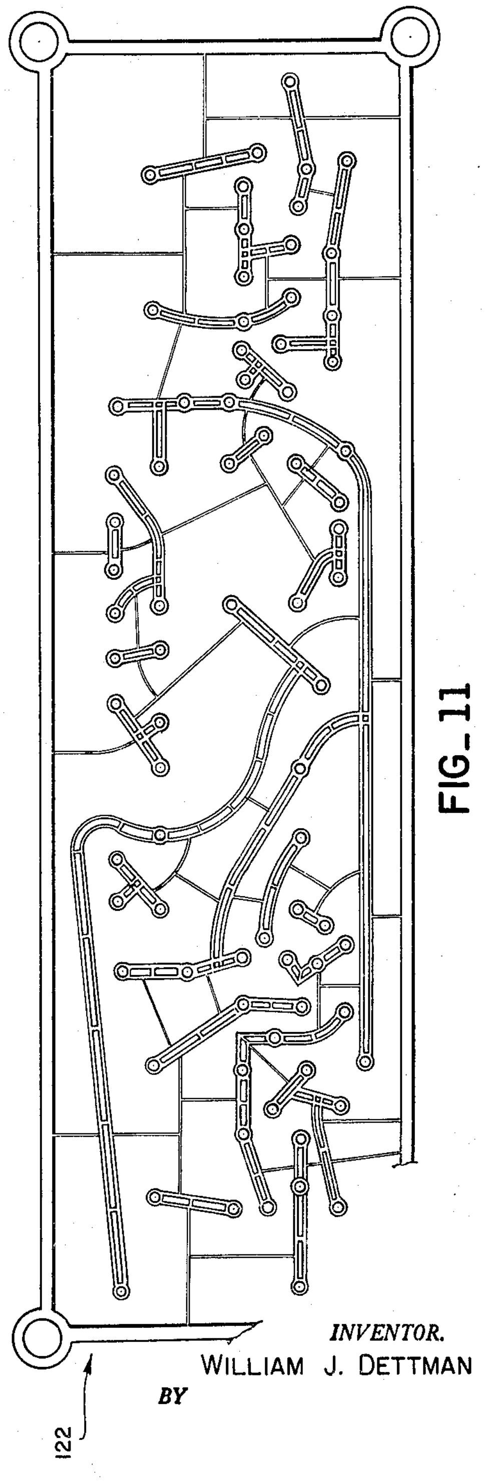
Figure 12:
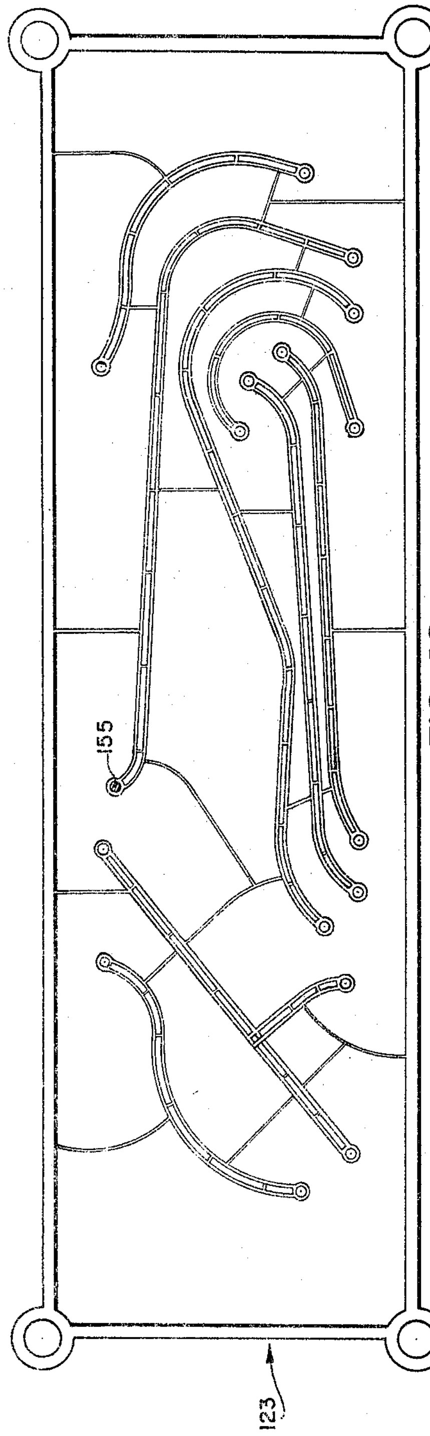
Figure 13:
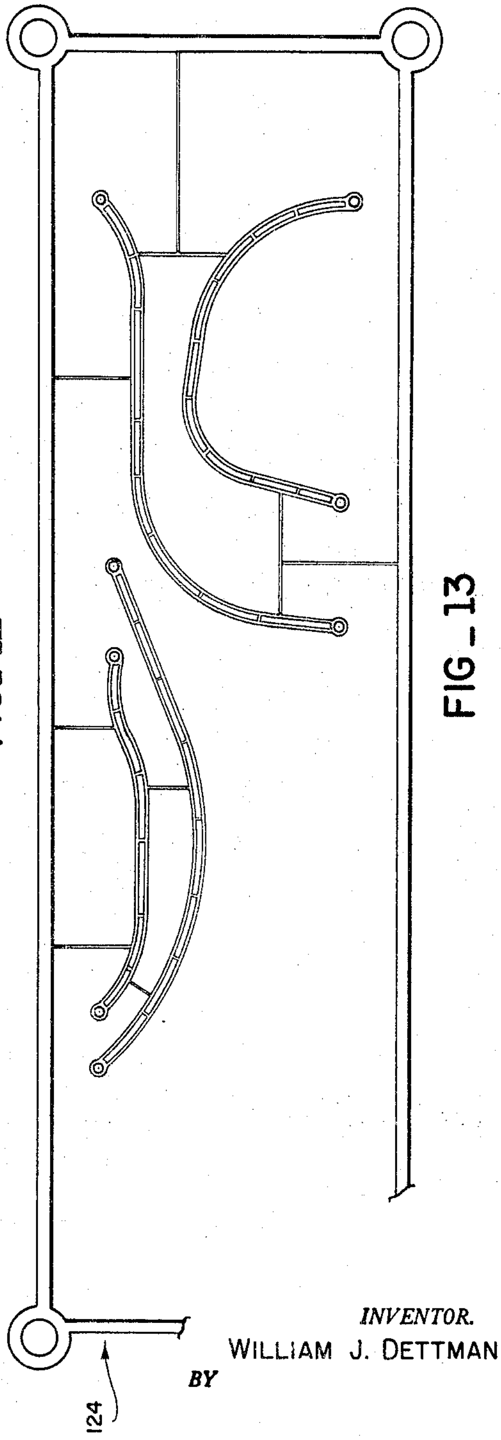
Figure 14:
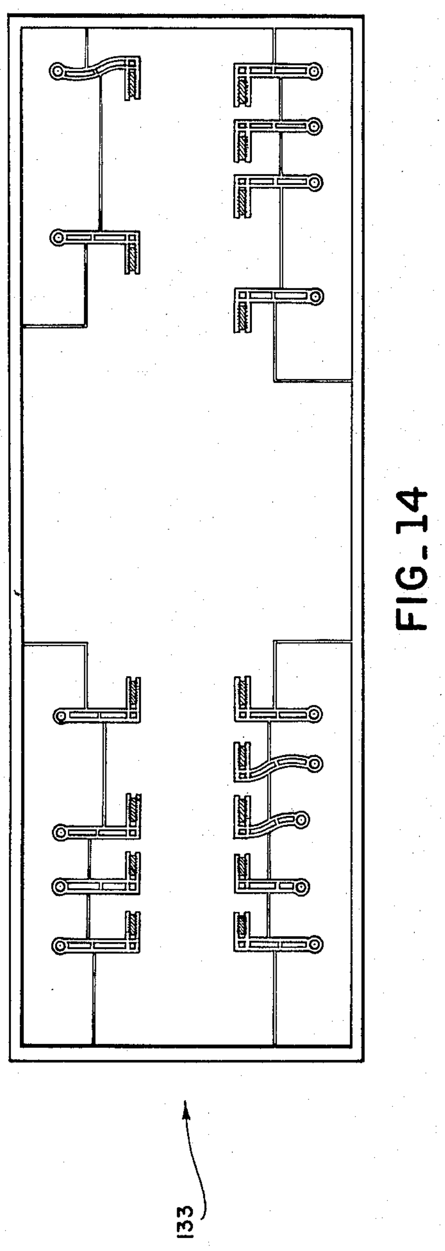

The method of assembly of package 101 is as follows: Initially, preformed conducting elements 111 and 113 and preformed insulating elements 112 and 114 are positioned in a jig in spaced relation substantially as shown in FIGURE 7. Electrical components 116 and 131 are then connected in place by welding or the like. Then support members 141, as shown in FIGURES 8 and 9, are severed and outer frames 142 and the severed support members are removed thereby completing electrical section 103. At this juncture it is important to note that if it is desirable to pot electrical section 103, it is generally desirable to sever and remove only those preformed insulating element support members (which correspond with support members 141 of preformed conducting elements 111 and 113) that extend beyond the outer periphery of the preformed conducting elements. The support members of preformed insulating elements 112 and 114 that are inside the outer periphery are left intact and thereby provide added structural strength. If it is necessary to dispose electrical sections 103 and 104 in a container, it has been found highly desirable to leave all of the preformed conducting elements intact, and employ a container having a configuration the same as the outer periphery of the frames (which would correspond with frames 142 of preformed conducting elements 111 and 113) of the preformed insulating elements. In this manner the preformed insulating elements also function as supports for electrical sections 103 and 104.

After electrical section 103 is assembled as hereinabove described, electrical section 104 is then assembled in much the same manner. It should be noted that electrical components 129 and 131 are first connected to preformed conducting elements 121 and 122 and the necessary support member cutting is preformed. Then the proper electrical components are connected to preformed conducting element 123 and then connected to preformed conducting element 124. Preformed insulating elements 126, 127 and 128 are sequentially inserted between these steps. It will be appreciated that, depending upon the circuit configuration, some lead wires may terminate at and be connected to a single aperture, whereas, other lead wires may be connected to two or more apertures. For example, the upper lead wire of an electrical component may be connected to aperture 151 of conducting element 111 (FIGURE 8) and the lower lead wire passed through aperture 153 of conducting element 113 (FIGURE 9) to aperture 155 of conducting element 123 (FIGURE 12) and then connected to apertures 153 and 155.

After electrical sections 103 and 104 are individually assembled, they are assembled together. Then section 105 is assembled and connected to assembled sections 103 and 104. It will be appreciated that no particular sequence for assembly of individual sections 103, 104 and 105 is necessary; however, they must be individually assembled prior to their being interconnected. After completion of the above steps, assembled and interconnected sections 103, 104 and 105 are enclosed by casing 106.

Figures 16, 16A, 16B:
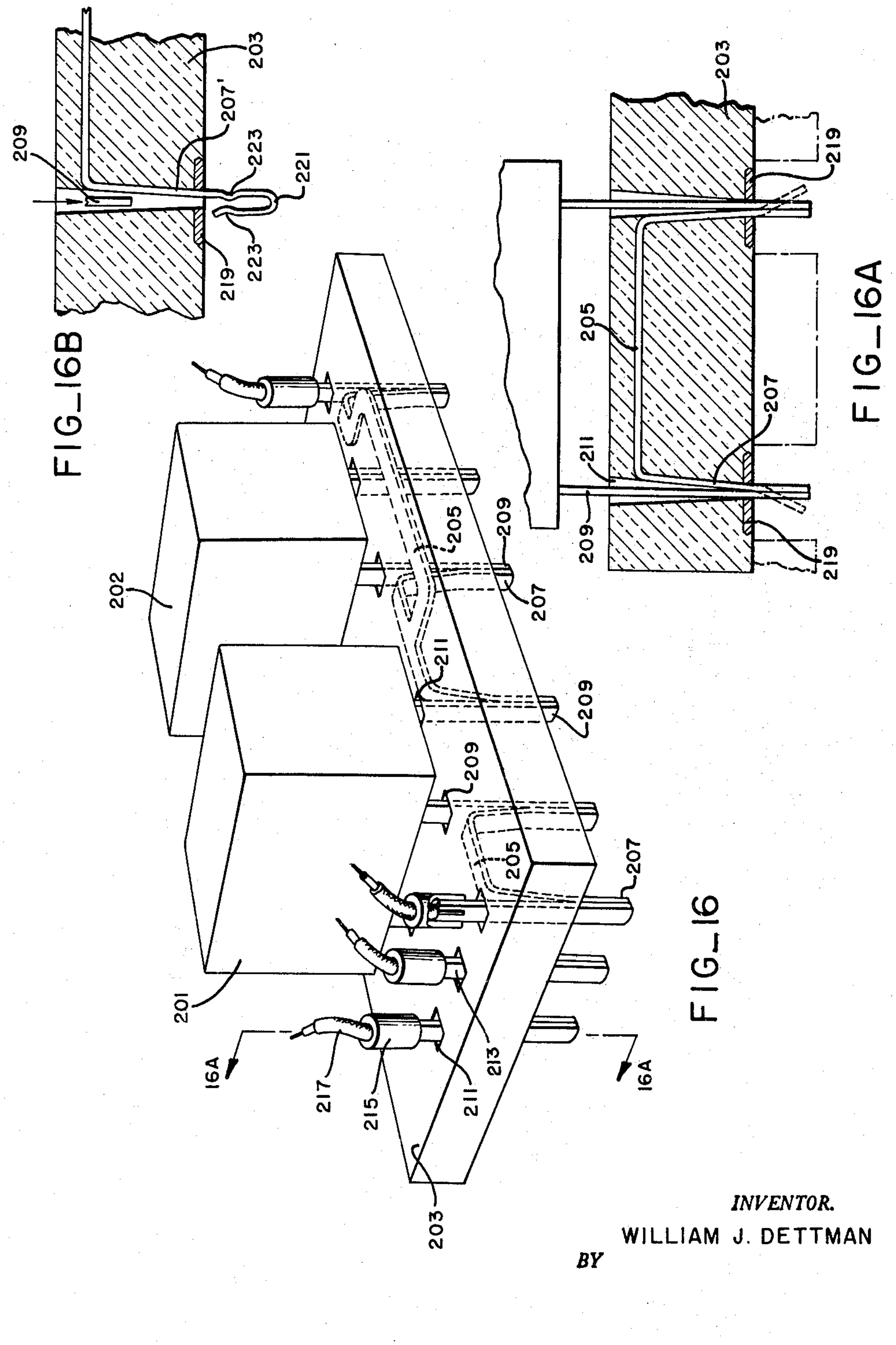
FIGURE 16 is a perspective view of a plurality of modular packages mounted on a terminal module.
FIGURE 16A is a sectional view of a portion of FIGURE 16 and particularly illustrating the cooperation between the terminal extensions of the modular package and terminal extensions of the terminal module.
FIGURE 16B is a sectional view of an alternate technique for forming the spring bias characteristic of the terminal extensions of the terminal nodule.
Figures 16C, 16D:
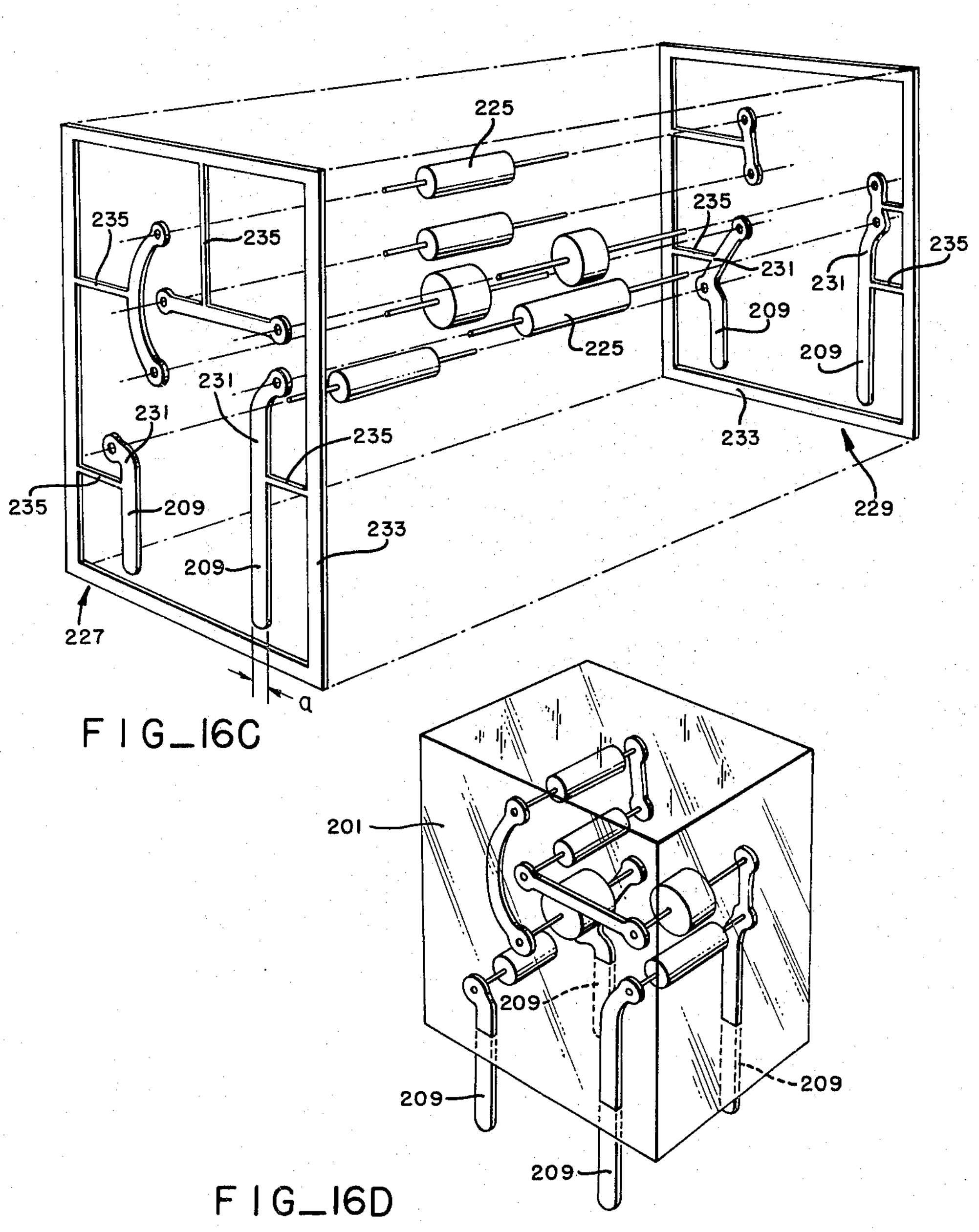
FIGURE 16C is an exploded view particularly illustrating the technique for integrally forming terminal extensions in the preformed circuitry and depicting the method of assembly of a modular package having terminal extensions.
FIGURE 16D is a perspective view of a complete modular package assembed in accordance with FIGURE 16C and capable of being mounted on the terminal module of FIGURE 16.

In FIGURE 16 is illustrated a technique by which a plurality of modules, generally denoted by reference numerals 201 and 202, are mounted on a terminal module generally denoted by reference numeral 203. FIGURES 16A and 16B illustrate the technique by which the terminal extensions of the modules are formed and FIGURES 16C and 16D illustrate two techniques by which the terminal extensions of the terminal module may be formed.

Referring to FIGURE 16, terminal module 203 consists of conductors 205 having terminal extensions 207 which are potted therein. Terminal extensions 207 exert a spring bias against terminal extensions 209 of modules 201 and 202 which are inserted through openings 211 which are molded in terminal module 203. The particular method for forming openings 211 and for mounting conductors 205 and terminal extensions 207 by use of preformed circuitry will be hereinafter described in conjunction with FIGURES 22A and 22B. However, the particular configuration of two different terminal extensions which may be used with the terminal module will be described in conjunction with FIGURES 16A and 16B. Connectors 213 are held in position by the spring bias of terminal extensions 207 and conventional fastening members 215, which contract upon the application of heat thereto, are provided to interconnect external lead wires 217 to terminal extensions 207 and the corresponding conductors 205.

In FIGURE 16A is illustrated a sectional view, taken along line 16A—16A of FIGURE 16, which more clearly depicts the placement of and configuration of conductors 205, terminal extensions 207 and 209 and openings 211. The dotted lines illustrate the original position of terminal extensions 207, prior to insertion of terminal extension 209 into contact therewith. Upon insertion of terminal extension 209, terminal extension 207 will assume the solid line configuration and is designed such that the elastic limit thereof is not exceeded and will therefore exert a force against terminal extension 209 thereby providing sufficient contact for most purposes. The purpose of washers 219 will be hereinafter described with relation to FIGURES 22A and 22B.

In FIGURE 16B is illustrated a sectional view of an alternate method for forming the terminal extension of the terminal module. Terminal extension 207' is provided with a looped end section 221 having inwardly extending detents 223 such that the distance between the inner surface of the detents is less than the width of terminal extension 209 wherein they will exert a force against terminal extension 209 when inserted therebetween.

With relation to terminal module 203, it is to be understood that the depth thereof could be increased such that the ends of terminal extensions 207 and 209 would be above the lower plane surface of the terminal module as illustrated by the broken lines in FIGURE 16A. Apertures of any desired and compatible configuration would be formed in the mold to receive the ends of terminal extensions 207 and 209. By this technique it would then be possible to mount the terminal module directly on a plane surface without impairing or electrically shorting the various terminal extensions. However, in those instances where it is considered desirable to wire wrap the terminal extensions, ease of wire wrapping is enhanced by allowing the ends of terminal extensions to depend beyond the lower surface of the board as illustrated and then mount the terminal module such that the ends of the terminal extensions are free.

It will also be appreciated that the terminal module may be formed without resorting to terminal extensions. For example, the preformed elements of the terminal module could use apertures of the type shown in FIGURES 19A and 19B in place of the terminal extensions. Male die members, having an outside configuration slightly less than the outside configuration of oval section 261, would extend in opposite directions and be in facial contact with the opposite surfaces of oval section 261. Upon removal of the terminal module from the mold, openings would be provided such that module terminal extensions or the like could be inserted into the spring biased apertures.

In FIGURE 16C is illustrated an exploded view particularly illustrating the technique for integrally forming terminal extensions 209 in the preformed elements and depicting the method of assembly of electrical components 225 to form a module having integrally formed terminal extensions. The manner in which preformed elements 227 and 229 are originally formed, prior to assembly, is illustrated in FIGURE 16C which shows terminal extensions 209 as extending from conductors 231 which are connected to frame 233 by support members 235. In this manner it is possible to form the terminal extensions from the same sheet of flat material from which the frame, support members and conductors are formed. Since the width, denoted by the letter "*a*" in FIGURE 16C, may be selected at virtually any desired value, it is possible to provide terminal extensions of considerable strength such that they may be repeatedly inserted into and removed from terminal module 203 without impairment of their physical or electrical characteristics.

FIGURE 16D illustrates the complete module as assembled in accordance with FIGURE 16C and in accordance with the previously described method of soldering or welding the electrical component lead wires to the appropriate apertures and removing the frame and severed support members. The assembled circuitry is illustrated as being encapsulated in a potting compound or the like. However, it is to be understood that it may remain as an exposed circuit or it may be encapsulated by a container made of plastic, metal or the like. Although not shown in the drawings, an encapsulating container may be attached directly to terminal extensions 209. For example, each terminal extension may be provided with a pair of spaced apart outwardly extending members, each of which may have a configuration similar to members 335 of FIGURE 22A. Inwardly extending members from the encapsulating container could extend between the pair of spaced apart outwardly extending members thereby providing a firm connection between the terminal extensions and the container.

Another technique which may be employed is to provide an enlarged section with an opening therein at the upper portions of terminal extensions 209. Pins could then be inserted through openings in the encapsulating container and through the corresponding openings in the terminal extensions. Appropriate insulation could be provided if the container were made of metal, for purpose of shielding or the like, and when a particular terminal extension is at ground potential, the metal shield could be grounded by use of a pin made of electrical conducting material. Many other types of connection arrangements could be improvised since it is an extremely simple procedure to modify the configuration of that portion of the terminal extensions which would cooperate with the container to provide an interconnection. It will be particularly appreciated that by connecting the container directly to the terminal extension that all of the stress created by insertion and removal of the module from the terminal module is applied only to the terminal extension and along the longitudinal axis thereof thereby obviating bending or impairment of the terminal extension as well as the conductors, electrical components and soldered connections.

In view of the above, it can be seen that a method of forming terminal extensions is provided which has many advantages heretofore not possible. The primary advantage is that the terminal extensions are formed as an integral part of the preformed circuitry and can be made of virtually any desired configuration. Another advantage of this technique is that terminal extensions 209 extend outwardly from the module wherein the bottom surface of the module abuts against terminal module 203, upon insertion of the module in place, and thereby provide considerable rigidity and reduces the stress applied to the terminal extensions. Furthermore, by virtue of integrally forming terminal extensions of the type described, it is possible to readily attach an encapsulating container thereto thereby providing a rigid and reliable structure. As pointed out with respect to the previous embodiments, the preformed circuit of the present invention provides high current carrying capacity and high rigdity since conductor thickness of .040 to .050 of an inch may be realized by present etching techniques.

Figure 17:
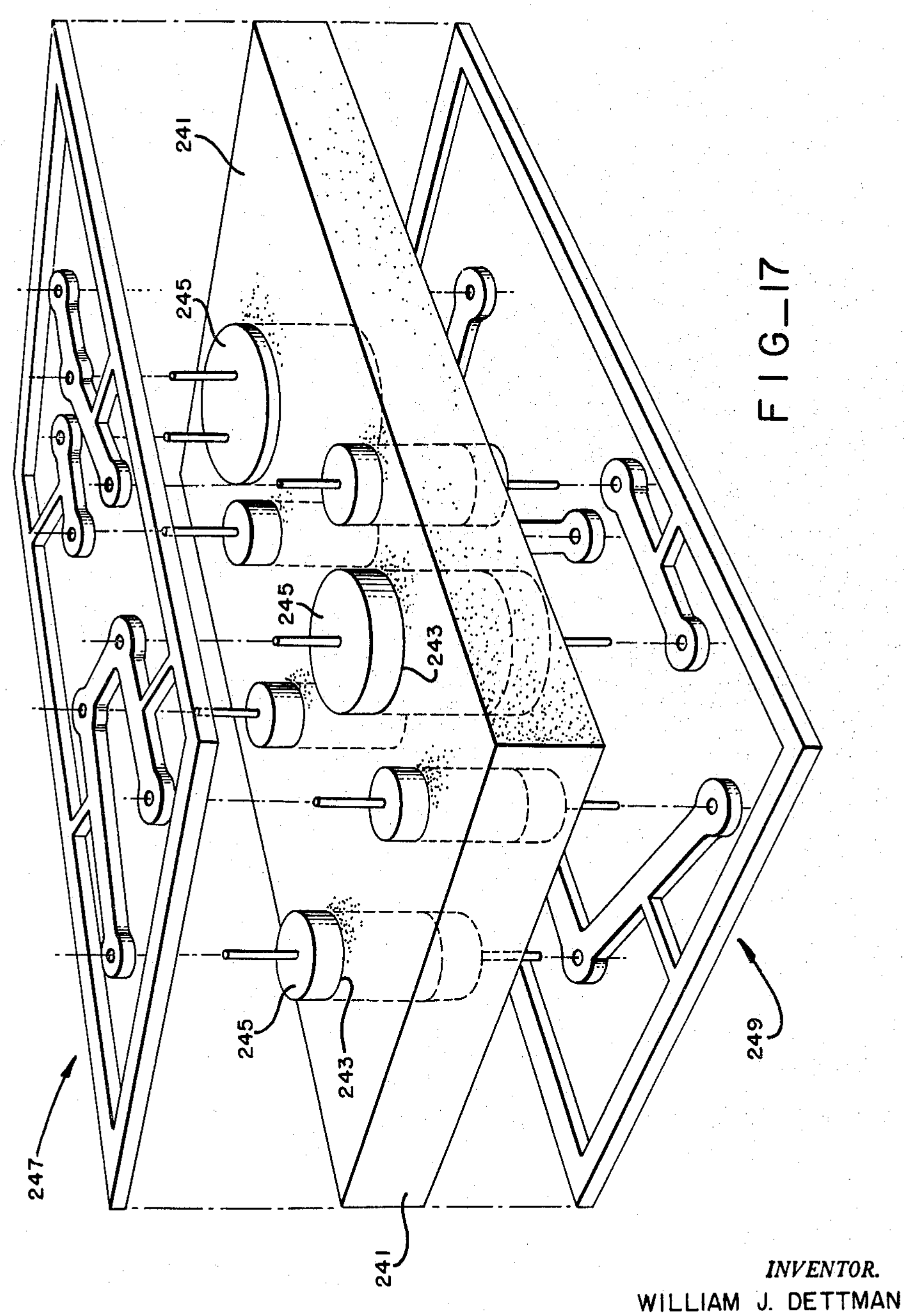
FIGURE 17 is an isometric view of an assembly technique for assembly of modular packages made from the preformed circuitry of the present invention.

In FIGURE 17 is illustrated one method by which rapid assembly of the electrical components and the preformed elements may be accomplished. Plate 241, having a plurality of openings 243 of about the same configurations as the outer surface of the electrical components associated therewith, is loaded with a plurality of electrical components 245. Preferably, plate 241 has a relatively large width such that the longitudinal axis of the electrical components mounted therein will remain nearly parallel and will not become skewed by their own weight or by other small forces which might be applied thereto. In addition, it is preferable that openings 243 in plate 241 have a slightly smaller cross section than the corresponding electrical component and be made of a sufficiently pliable material so the components may be positioned by the application of a slight force but will not become dislodged by their own weight.

After the components are correctly placed in plate 241, the apertures of preformed elements 247 and 249 are inserted over the lead wires of the electrical components. The lead wires may then be mechanically and electrically connected to the conductors by a solder dip process wherein preformed elements 247 and 249 and the associated component lead wires are alternately immersed in molten solder. Then the frame and structural members are removed by serving these structural members as previously explained. It has been found that an effective heat sink may be provided by forming the area surrounding one or more of the openings of plate 241 from the high heat conducting material such as copper or, for certain applications, making plate 241 entirely of high heat conducting material.

Figures 18A, 18B, 19A, 19B:
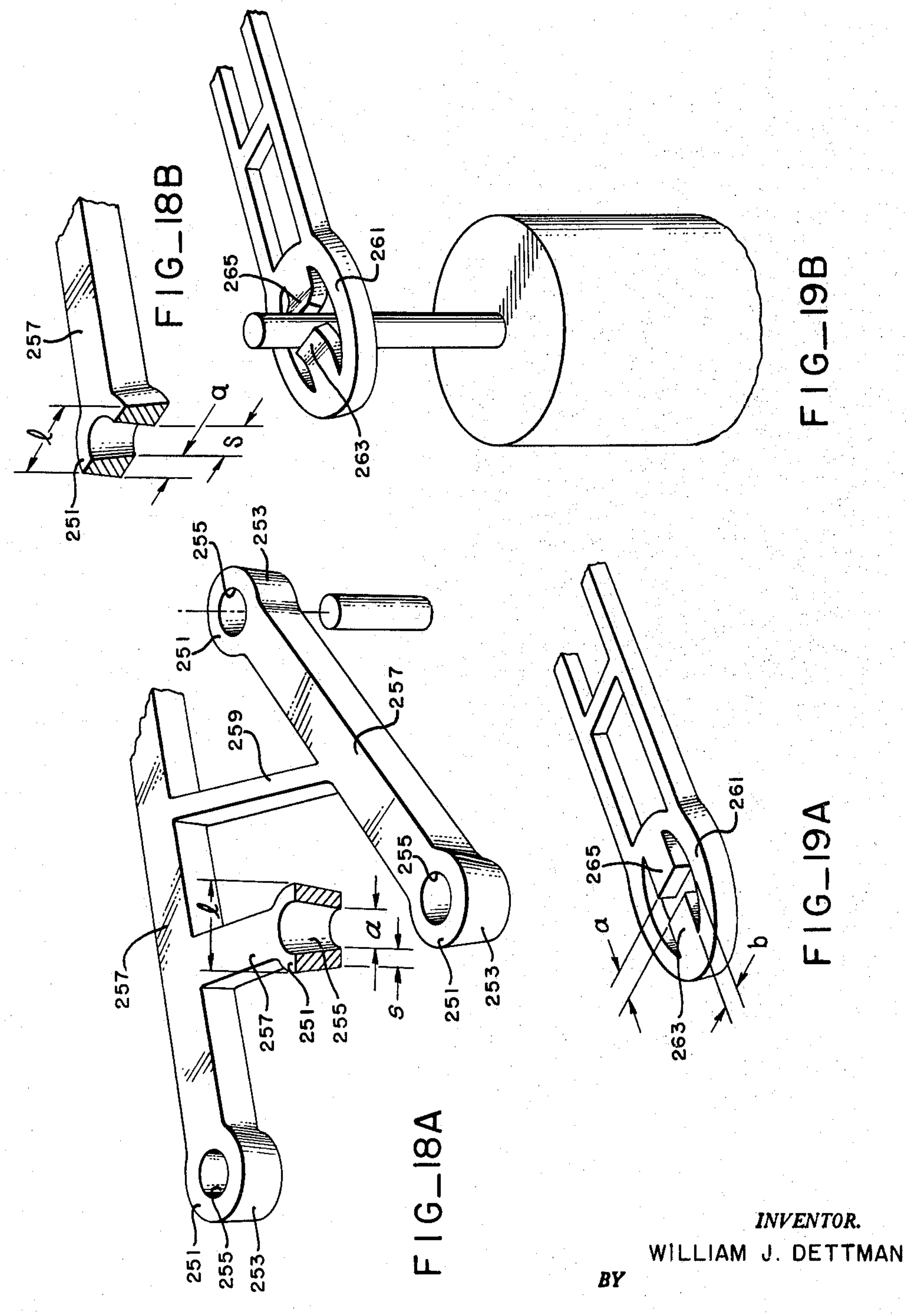
FIGURE 18A is an enlarged perspective view, partly in section, illustrating a technique for forming apertures having a frusto-conical configuration.
FIGURE 18B is an enlarged sectional perspective view of an alternate technique for forming apertures having a frusto-conical configuration.
FIGURE 19A is an enlarged perspective view of another technique for forming apertures for the preformed circuits of the present invention.
FIGURE 19B is an enlarged perspective view illustrating the cooperation between the apertures illustrated in FIGURE 19A and an electrical component lead wire.

In FIGURES 18A and 18B are illustrated other embodiments of apertures which are formed by etching techniques and have been found to be particularly suitable for soldered connections and for ease of assembly. Apertures 251 of FIGURE 18A have a frusto-conical exterior surface 253 and a frusto-conical interior surface 255 wherein the wall thickness "*a*" is about constant throughout the entire length of the aperture. The small diameter of aperture 251 is selected to be slightly greater than the outside diameter of the lead wire which is to be inserted therethrough. Upon the insertion of a lead wire into an aperture, it can be seen that a cavity is formed between the lead wire and interior surface 255 wherein the bottom of the cavity is effectively sealed by the close spaced relationship between the lead wire and the small diameter of the aperture. This cavity forms a pocket into which solder may flow and therefore provides intimate contact between nearly all of interior surface 255 and the component lead wire disposed therein. Highly reliable electrical and mechanical connections have been formed by this technique.

Another extremely advantageous feature of the frusto-conical aperture is its unique attribute of allowing ease of insertion of the electrical component lead wire during assembly operations. That is, the large diameter "l" of the aperture is considerably greater than the diameter of the lead wire and therefore the longitudinal axis of the lead wire need not be coincident with the longitudinal axis of the aperture for purpose of insertion. This is the case since the sloping interior aperture surface will gradually return these axes to an approximately coincident condition while the lead wire is being inserted through the aperture. The advantage of this technique will become apparent upon considering FIGURE 17 and assuming the apertures of preformed elements 247 and 249 are frusto-conical with the large diameters thereof being directed towards each other. Since it is virtually impossible to exactly align the component lead wires with corresponding apertures having about the same diameter, the use of frusto-conical apertures greatly facilitate assembly since they will compensate for misalignment. It will be apparent that misalignment of half the difference between the large diameter of the aperture and the diameter of lead wire is permissible which has been found to be adequate for many operations.

The method by which the apertures of FIGURE 18A are formed is as follows: The top surface of the metal sheet from which the apertures are formed is coated with an acid-resist except for a circle coincident with the axis of the aperture and having a diameter of about the desired small interior diameter of the aperture as denoted by "s" in FIGURE 18A. In like manner, the bottom surface of the metal sheet is provided with an acid-resist except for a circle coincident with the axis of the aperture and having a diameter of about the desired large exterior diameter as denoted by the letter "l." The plate is then immersed in an acid bath.

It will be particularly appreciated that acid will etch in both the down and side directions and will therefore form approximately conical surfaces. Since the material immediately under the acid-resist will generally not be completely removed by the acid, it is generally desirable to terminate the etching process prior to etching through the entire sheet thickness.

At this juncture, one of two approaches may be employed. The first approach is to remove all of the acid-resist and immerse the plate in an acid bath to remove a thin layer of material from the top and bottom of the sheet. The thickness of each of these removed layers is about the same as the thickness of the material remaining in the immediately preceding step, thereby forming about the same configuration as illustrated in FIGURE 18A. The second approach is to recoat the bottom surface with an acid-resist except for a circular area having a diameter "s" concentric with the aperture. The same operation is performed at the top surface except the exposed circular area has a diameter "l." The plate is then immersed in an acid bath for a time sufficient to back etch to the previously etched out openings. This latter technique has advantages over the former since the diameters "l" and particularly "s" are held to closer tolerances. Closer tolerances are realized by this latter technique since error increases as a function of etched thickness and the back etching is through a much lesser thickness than was the forward etching.

For purpose of clarity, the above description has not taken into account the formation of conductors 257 or support member 259 as well as the associated frame. It will be appreciated that the patterns formed in the acid-resist may include these elements and they may be subjected to the same process, with obvious modification, as described above with relation to the formation of the apertures.

In FIGURE 18B is illustrated another technique for forming apertures which provide a cavity between the lead wire and the interior surface of the aperture. This embodiment differs from the previous embodiment in only one essential feature. That is, the aperture thickness is greater at the bottom than at the top. This is accomplished by coating the entire bottom surface with an acid-resist. The interior surface of the aperture is formed as previously described with relation to the FIGURE 18A embodiment. However, the exterior surface of the aperture is formed by removing an annular area of acid-resist from the upper surface which is concentric with the circular area used for forming the interior aperture surface. Either of the above-described back etching techniques, with obvious modification, may be employed.

In FIGURES 19A and 19B is illustrated another technique of forming the apertures of the present invention. These apertures consist of an oval section 261 and two inwardly extending members 263 and 265. The distance "a" between members 263 and 265 is selected to be less than the diameter of the lead wire and the distance "b" is selected to be less than the radius of the lead wire. Since the distance "b" is less than the radius of the lead wire, the maximum width of the lead wire will always be in contact with members 263 and 265. Therefore, a controlled constant bias force will be exerted by members 263 and 265 against the lead wire when inserted therebetween. As a result, it is possible to obtain consistency in the required minimum constant force between all of the electrical components and the associated apertures.

Another particularly advantageous feature of this embodiment is that ease of assembly is considerably enhanced since the width between the opposite inner surfaces of oval section 261 is considerably greater than the diameter of the lead wire thereby simplifying the lead wire insertion process. It has been found that the spring bias exerted by members 263 and 265 provides sufficient electrical contact for many applications and therefore eliminates welding, soldering or the like. It will be appreciated, however, that this spring bias will also be sufficient to hold the lead wire in place if it is desirable to subsequently weld, solder or the like.

Figures 20, 21A, 21B, 21C, 21D, 21E:
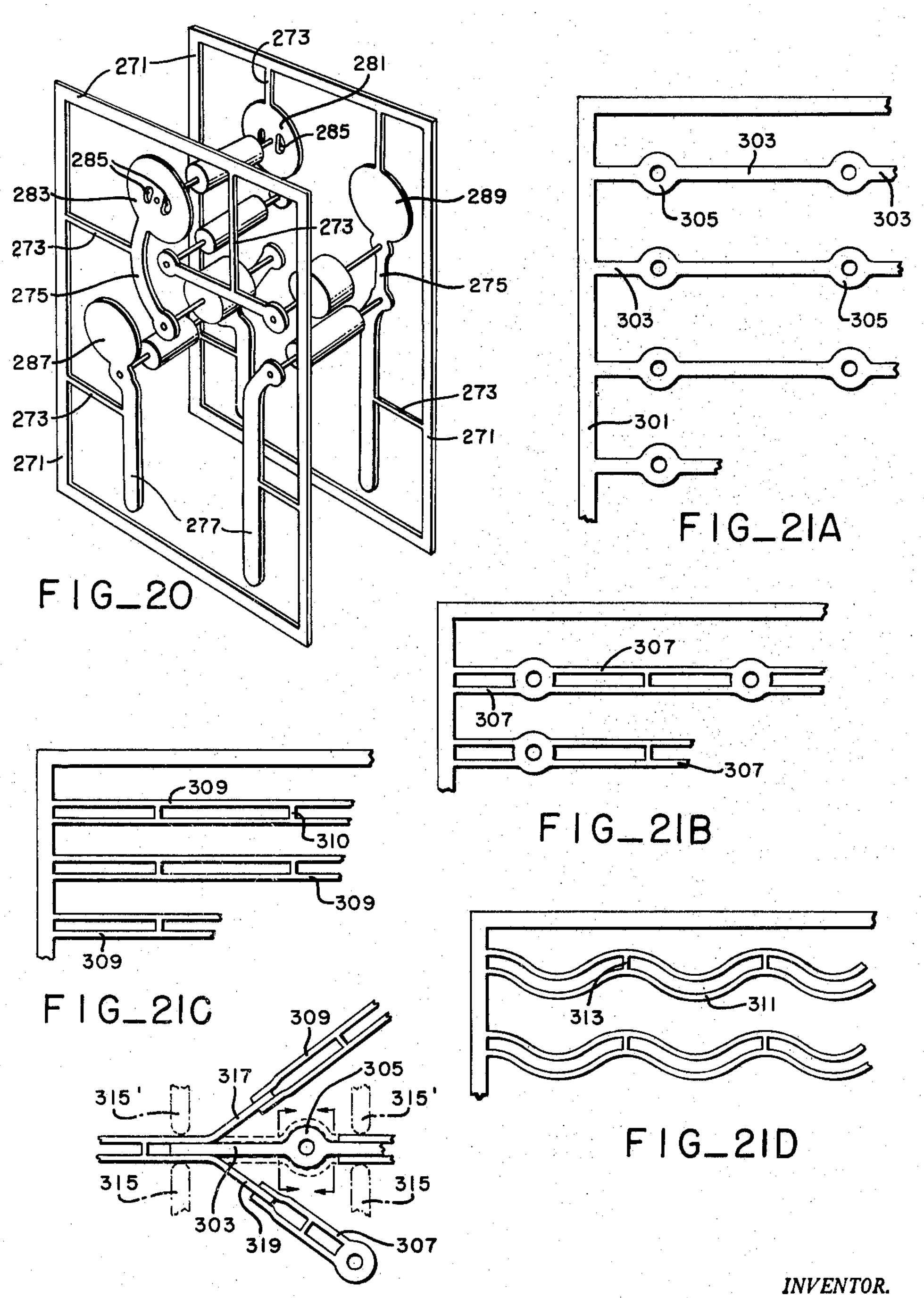
FIGURE 20 is a perspective view of a modular package depicting a technique wherein heat sinks are integrally formed in the preformed circuitry for dissipating heat from the electrical components.
FIGURES 21A through 21D illustrate a plurality of preformed repair elements which are employed to facilitate repair or modification of modular packages made by the preformed elements of the present invention.
FIGURE 21E illustrates a typical method by which repair and/or modification of a module is accomplished by the preformed repair elements shown in FIGURES 21A through 21D.

In FIGURE 20 is a perspective view of a module depicting a technique wherein heat sinks are integrally formed in the preformed circuitry for dissipating heat from the electrical components. Each of the preformed elements shown in FIGURE 20 consist of a frame 271, support members 273, conductors 275, terminal extensions 277 and heat sinks. The area, placement and configuration of the heat sinks is dependent upon the necessary heat dissipation required, the placement of the electrical components and the like. Assume, for example, that a relatively large heat sink is required for electrical component 279. This being the case, heat sink 281 is integrally formed with the aperture for one lead wire, and heat sink 283 is integrally formed with the aperture for the other lead wire. If, due to interfering circuitry, it is not possible to have an adequate heat sink by extending it in one general direction, it has been found highly advantageous to form the heat sink such that it surrounds the aperture. This latter technique is illustrated by heat sinks 281 and 283. It will be particularly noted that heat sinks 281 and 283 are provided with openings 285 which are adjacent the aperture such that the electrodes of a welding machine may be inserted into the openings to form a weld. If large heat dissipation is not required, single heat sinks may be provided for electrical components as illustrated by heat sinks 287 and 289. Although not shown in the drawings, the formation of heat sinks of sufficient length and configuration make it possible to bend the heat sink into physical contact with the body of an electrical component. In this manner efficiency may be enhanced since dissipation of heat from the electrical component is directly to the heat sink.

Not only is it possible to form heat sinks in an inexpensive and simple manner by integrally forming them with the preformed elements, but the heat sinks thus provided are extremely efficient since they may be made relatively thin, have a large surface area and radiate heat from both surfaces to the surrounding atmosphere.

In FIGURES 21A through 21D are illustrated preformed elements which are employed to facilitate repair and modification of modular circuits made in accordance with the present invention as hereinbefore described.

The preformed repair element, shown partly in section in FIGURE 21A, consists of frame 301 and a plurality of strings of preformed nonredundant conductors 303 and apertures 305. The nonredundant conductors and apertures of each string are alternate and serially interconnected and the ends of the nonredundant conductors are integrally formed with frame 301. In FIGURE 21B is illustrated, partly in section, a preformed repair element which is the complement of the preformed repair element shown in FIGURE 21A. The primary difference between the FIGURE 21A repair element and the FIGURE 21B repair element is that conductors 307 of the FIGURE 21B repair circuit are made redundant. The reason for employing this complementary arrangement will hereinafter become apparent.

In FIGURE 21C is illustrated another preformed repair element comprising a plurality of strings of redundant conductors 309 with crossover members 310. The complement to this preformed repair element would be a plurality of strings of nonredundant conductors, not shown. In FIGURE 21D is illustrated another type of preformed repair element consisting of a plurality of strings of redundant conductors 311 having an alternating semicircular configuration substantially as shown and having cross-over 313 at the points of minimum slope. The complement of this preformed repair element would be a plurality of strings of non-redundant alternating semicircular conductors, not shown.

It is to be understood that various modifications of particular shaped preformed repair elements would fall within the purview of one skilled in the art. For example, various geometrical curves could be employed, depending upon the need, in place of or in addition to the semicircular configuration shown in FIGURE 21D. In addition, rectangular and/or "T" type configuration could be made either redundant or nonredundant. It has been found satisfactory to form ten to twenty strings wherein each string may have from ten to twenty segments (that is, each string of the preformed repair element of FIGURE 21D would have between ten and twenty apertures). It is to be understood, however, that any number of strings or segments may be formed to comply with particular needs and convenience.

In FIGURE 21E is illustrated the technique by which these preformed repair elements are employed. Suppose, for example, that electrical component 35 of FIGURE 2C failed and it was desirable to replace it with a new electrial component. In addition, assume that is also desirable to modify the circuit by adding one or more electrical components and/or change the electrical conductor paths. The dotted lines of FIGURE 21E indicates original conductor 19 and aperture 23 associated with electrical component 35 of FIGURE 2C. In order to remove the electrical component, the redundant conductors are severed as indicated by the opposed arrows of FIGURE 21E. Aperture 305 and conductors 303 are then severed from the preformed repair element shown in FIGURE 21A and have the lengths substantially as illustrated in FIGURE 21E. The width of conductors 303 are selected to be about the same as the space between the redundant conductors. Upon insertion of the conductors 303 between the redundant conductors, they are electrically and mechanically connected by welding as indicated by electrodes 315 and 315'.

It will be particularly noted that individual conductors 317 and 319 are outwardly bent and redundant conductor 309, severed from the redundant repair element of FIGURE 21C, is connected to conductor 317. Redundant conductor 307 and a corresponding aperture are severed from the redundant repair element of FIGURE 21B and connected to conductor 319.

In FIGURES 21B through 21E, the space between the redundant conductors is about twice the width of each conductor of the redundant conductors and the width of the single conductors in FIGURES 21A and 21E have a width about equal to the space between the redundant conductors and about twice the width of each conductor of the redundant conductors. These width relationships are provide so both the redundant and single conductors will have the same current carrying capacity and the single conductor may be inserted into the space between the redundant conductors without the necessity of bending as illustrated in FIGURE 21E. However, from FIGURE 21E is will be noted that it is necessary to inwardly bend the individual conductors of redundant conductors 307 and 309 into facial contact with individual conductors 319 and 317, respectively, in order to provide circuitry modifications.

For many applications, current carrying capacity is not a problem and where this is the case, it has been found highly desirable to form the single conductors (FIGURE 21A), the individual conductors of the redundant conductors, and the space between the redundant conductors of about the same width. In this manner both repair and circuit modification can be performed without the necessity of bending which considerably reduces the time of assembly.

After the above repair operations are completed the electrical component lead wires are connected to the appropriate apertures and redundant conductor 309 is connected to the remaining circuitry as desired. The above example is cited only as an illustrative technique by which repair and circuit modifications may be accomplished with the preformed repair elements of the present invention. It is to be understood that many different types of repair operations may be accomplished, both as to redundant and nonredundant circuits, by the use of the preformed repair elements of the present invention and the implementation thereof is considered to be within the purview of one skilled in the art.

Figure 22A:
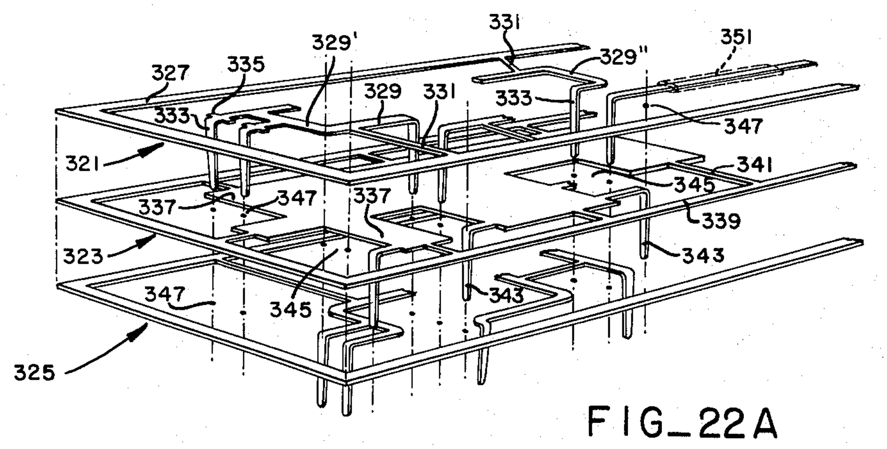
FIGURE 22A is an isometric view illustrating the method of forming a terminal module and is particularly directed to a technique by which individual sections of the terminal module may be electrically isolated.
Figure 22B:
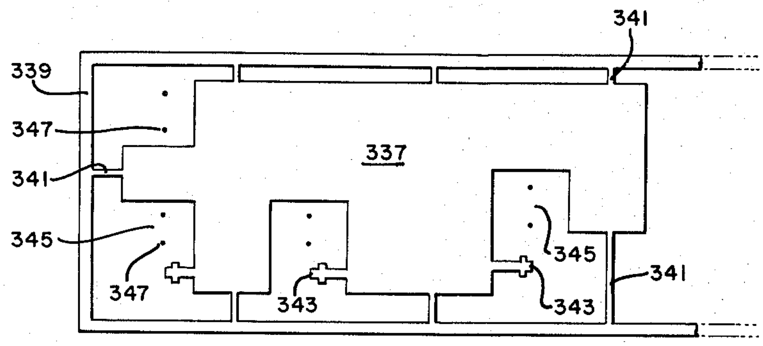
FIGURE 22B is a plane view of the preformed ground element illustrated in FIGURE 22A for providing electrical isolation between individual sections of the terminal module.
Figure 22C:
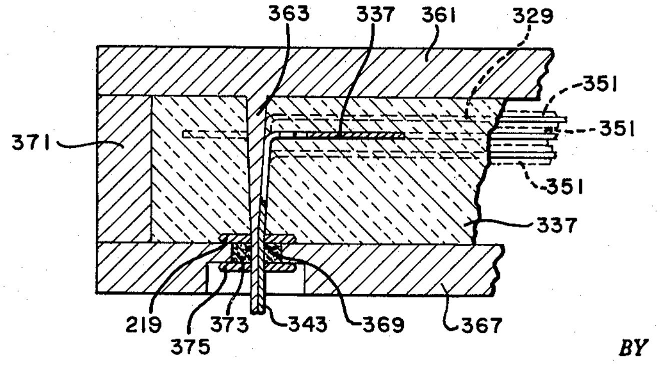
FIGURE 22C is a sectional view of a portion of the assembled terminal module formed in accordance with FIGURE 22A.

FIGURES 22A through 22C illustrate a method for forming a terminal module and are particularly directed to a technique by which individual sections of the terminal module are electrically isolated. FIGURE 22A is an isometric view illustrating preformed elment 321, preformed ground element 323 and preformed element 325. Preformed element 321 consists of frame 327, conductors 329, support members 331 and terminal extensions 333. Terminal extensions 333 may be provided with outwardly extending members 335 to provide a tooling stop for accurately bending terminal extensions 333 at a ninety degree angle from the plane defined by the preformed element in which they were originally included. (See FIGURE 16C as an example of how the terminal extensions are originally formed prior to bending.) It will be particularly noted that preformed element 321 includes no apertures to which lead wires are connected since the function thereof, as well as preformed element 325, is to provide the required interconnecting circuitry, by means of conductors 329, between the various modules which are mounted on the completed terminal module. (See FIGURE 16.) Preformed element 325 includes the same features as preformed element 321 and will therefore not be described. However, it should be noted that the path of the conductors will be different since they will interconnect different sections of the modules which are mounted on the terminal module. In addition, the location of the terminal extensions will be different since they must not interfere with terminal extensions 333 of preformed element 321 when assembled.

Preformed ground element 323 consists of a solid sheet of conducting material 337 which is connected to frame 339 by support members 341 and includes terminal extensions 343. Preformed ground element 323 also includes slotted openings 345 to prevent interference with the terminal extensions of preformed element 321 as well as the module terminal extensions which will be inserted into the terminal module. The broken lines and corresponding indicia 347 depict the alignment of the terminal extensions of the various preformed elements and illustrate their spacing with respect to each other.

After bending all of the terminal extensions of preformed elements 321, 323, and 325, the preformed elements, except the bent terminal extensions, are dipped in or sprayed with a coating of insulating material as generally denoted by refernece numeral 351.

The method of assembly of preformed elements 321, 323 and 325 into an encapsulated terminal module is as follows: A base plate 361 having a plurality of tapered male members 363 is provided wherein the number and placement of these male members correspond with indicia 347. Initially, preformed element 321, which has been coated with insulating material, is mounted such that terminal extensions 333 are adjacent corresponding members 363. Then washers 219 are inserted over the ends of male member 363 and the terminal extensions of preformed element 321. From FIGURE 22C it can be seen that the end portion of male member 363 is of constant width and then begins to taper. The opening of washer 219 is selected such that it will extend only slightly onto the taper such that it will firmly interconnect the terminal extension to the male member. After preformed element 321 is mounted, support members 331 are severed and removed along with frame 327.

The next step is to mount preformed ground element 323, which has been coated with insulating material, in the same manner as described with relation to preformed element 321 and in facial contact therewith. The frame and corresponding support members are then removed. Then preformed element 325 is likewise mounted and the frame and support members removed. After all of these preformed elements have been mounted, closure plate 367 having apertures 369, is inserted over the extended terminals and male members and into facial contact with washers 219 and side plate 371. Then a pliable sealing compound 373 is disposed in apertures 369 and discs 375 are inserted thereover to hold the compound in position. Then potting compound 377 is inserted into the mold cavity. After the potting compound has hardened, plates 361, 367 and 371 as well as sealing compound 373 and washers 375 are removed resulting in a completed terminal module of the type substantially as illustrated in FIGURE 16. It can be seen that washers 219 serve to hold the terminal extensions in place, to prevent escape of potting compound 377 and to retain sealing compound 373 in position.

Referring now to the purpose of preformed ground element 323, it will be particularly noted that it functions to prevent electrical coupling between the field created by current passing through the various conductors and especially between the conductors associated with the respective modules. For example, if no shielding were provided, conductor 329' of preformed element 321 would create a field which would couple with conductor 329'' and the converse would be equally applicable. However, since conductor material 337 of preformed ground element is adjacent these conductors, the fields created thereby are localized and will therefore not couple. It will therefore be apparent that an extremely simple and effective shielding technique is provided by the use of preformed circuitry which has not been heretofore possible.

In connection with the above-described techniques, it is to be understood that in some applications a single preformed element may be positioned in spaced relation with respect to a conventional type terminal module to which the electrical component lead wires are to be connected. After connecting the lead wires to the conductors of the preformed conducting element and to the terminals of the terminal module, the support members are severed. In addition, it is to be understood that the particular configuration of the preformed elements is generally dictated by the type of electrical circuit which is being fabricated and that many of the illustrations set forth above are not actual electrical circuits but are employed to more clearly depict the unique features of the present invention. It will be obvious to one skilled in the art from the type of circuit involved, how to form the pattern of the preformed elements taking into account such factors as isolation between certain electrical components, the allowable resistance of the conductors and the like. Furthermore, it is to be understood that three or more individual spaced apart conductors may be employed to form the redundant conductors of the present invention. In addition, one of the unique advantages of preformed circuitry is that after being initially formed in a single plane, the preformed elements may be formed into curves of varying configurations without impairment thereof. In this manner, an annular ring of preformed circuits, consisting of a plurality of modules when assembled, may be formed. This annular ring could then be connected to an annular terminal module since the preformed elements thereof may likewise be curved. A technique of this type may provide considerable space saving in certain applications. An example of one application would be to mount these annular modules about the outer periphery of a television picture tube or the like.

Therefore, it is to be understood in connection with this invention that the embodiments shown are only exemplary, and that various modifications can be made in construction and arrangement within the scope of the invention as defined in the appended claims.

What is claimed is:

1. The method of making an electrical network by employing a pair of preformed elements each of which has a plurality of conducting elements integrally connected by support members to a frame comprising the steps of (1) mounting said pair of preformed elements by the respective frames in spaced relationship, (2) connecting electrical components to the conducting elements of the pair of preformed elements, and (3) severing the support members interconnecting the conducting elements and the associated frames.

2. The method of making an electrical network by employing a pair of preformed elements each of which has a plurality of conducting elements having at least two spaced apart conductors and at least one aperture disposed therein for receiving lead wires, a frame disposed outside the outer periphery of said conducting elements, support members interconnecting said spaced apart conductors and said frame, wherein said conducting elements, said spaced apart conductors, said frame and said support members are made of electrical conducting material and occupy a common plane comprising the steps of (1) mounting said pair of preformed elements by the respective frames in spaced relationship, (2) connecting electrical components to the conducting elements of the pair of preformed elements and (3) severing the support members interconnecting the conducting elements and frames.

3. The method of making an electrical network by employing a pair of preformed elements each of which has a plurality of conducting elements having at least two spaced apart conductors and at least one aperture disposed therein for receiving a lead wire, a frame disposed outside the outer periphery of said conducting elements, support members interconnecting said spaced apart conductors and said frame, wherein said conducting elements, said spaced apart conductors, said frame and said support members are made of electrical conducting material and occupy a common plane comprising the steps of (1) mounting said pair of preformed elements by the respective frames in spaced relationship, (2) connecting electrical components to the conducting elements of the pair of preformed elements, (3) severing the support members interconnecting the conducting elements and frame, and (4) encapsulating the electrical components and conducting elements by flowing potting compound normal to the plane defined by the spaced apart conductors of the conducting elements.

4. The method of making an electrical network having terminal extensions depending therefrom by employing a pair of preformed elements each of which has a plurality of conducting elements having at least one aperture disposed therein for receiving a lead wire, terminal extensions longitudinally depending in about the same direction from said conducting elements, support members interconnecting said conducting elements to said frame whereby said conducting elements, said terminal extensions, said support members and said frame being made of electrical conducting material and occupy a common plane comprising the steps of (1) mounting said pair of preformed elements by their respective frames in spaced relationship with the terminal extensions thereof extending in about the same direction, (2) connecting the lead wires of electrical components to the apertures of the pair of preformed elements and (3) severing the support members interconnecting the conducting elements and frames.

5. The method of making an electrical network by employing a pair of preformed elements comprising conducting elements, each of said conducting elements having at least one aperture disposed therein for receiving a lead wire, each of said apertures having a large and small diameter and about a frusto-conical interior surface defined therebetween, support member interconnecting said conducting elements to said frame whereby said conducting elements, said support members and said frame define a common plane and are made of electrical conducting material comprising the steps of (1) mounting said pair of preformed elements by their respective frames in spaced relation such that the large diameters of the apertures are in opposed relation, (2) inserting one lead wire of each of a plurality of electrical components through the large diameter of the apertures of one preformed element and inserting the other lead wire of each of said plurality of electrical components through the large diameter of the apertures of the other preformed element, (3) connecting each of the lead wires to the corresponding aperture and (4) severing the support members interconnecting the conducting elements and the frames.

6. A method of making an electrical network and for dissipating heat therefrom by employing a pair of preformed elements comprising conducting elements, a frame and support members for interconnecting said conducting elements to said frame, whereby said conducting elements, said support members and said frame define a common plane, at least one of said preformed elements having a heat sink comprising a relatively large surface area and connected to at least one of the conducting elements thereof and in the common plane defined thereby comprising the steps of (1) mounting said pair of preformed elements by their respective frames in spaced relation, (2) connecting the lead wires of electrical components to the conducting elements of the pair of preformed elements and (3) severing the support members interconnecting the conducting elements and frame, whereby the heat sink connected to the conducting element dissipates heat from the electrical component which has the lead wire connected thereto.

References Cited by the Examiner

UNITED STATES PATENTS

| | | | |
|---|---|---|---|
| 2,471,625 | 5/49 | Johnstone | 29—155.55 X |
| 2,508,030 | 5/50 | Karns | 174—68.5 |
| 2,911,572 | 11/59 | Francis et al. | 29—155.55 X |
| 3,039,177 | 6/62 | Burdett | 317—101 |
| 3,098,950 | 7/63 | Geshner | 29—144.55 |

FOREIGN PATENTS

| | | |
|---|---|---|
| 1,131,866 | 2/57 | France. |

WHITMORE A. WILTZ, *Primary Examiner.*

JOHN F. CAMPBELL, *Examiner.*